US011156684B2

(12) United States Patent
Warren et al.

(10) Patent No.: US 11,156,684 B2
(45) Date of Patent: Oct. 26, 2021

(54) METHOD FOR CREATING HYPERPOLARIZATION AT MICROTESLA MAGNETIC FIELDS

(71) Applicants: Duke University, Durham, NC (US); Vanderbilt University, Nashville, TN (US); Board of Trustees of Southern Illinois University, Carbondale, IL (US)

(72) Inventors: Warren S. Warren, Durham, NC (US); Thomas Theis, Durham, NC (US); Eduard Y. Chekmenev, Brentwood, TN (US); Milton L. Truong, Silver Spring, MD (US); Aaron M. Coffey, Nashville, TN (US); Boyd Goodson, Carbondale, IL (US); Fan Shi, Energy, IL (US); Roman V. Shchepin, Nashville, TN (US)

(73) Assignees: Duke University, Durham, NC (US); Vanderbilt University, Nashville, TN (US); Board of Trustees of Southern Illinois University, Carbondale, IL (US)

( * ) Notice: Subject to any disclaimer, the term of this patent is extended or adjusted under 35 U.S.C. 154(b) by 751 days.

(21) Appl. No.: 14/925,507

(22) Filed: Oct. 28, 2015

(65) Prior Publication Data

US 2016/0169998 A1 Jun. 16, 2016

Related U.S. Application Data

(60) Provisional application No. 62/069,542, filed on Oct. 28, 2014.

(51) Int. Cl.
*G01R 33/44* (2006.01)
*G01R 33/28* (2006.01)

(52) U.S. Cl.
CPC ......... *G01R 33/445* (2013.01); *G01R 33/282* (2013.01)

(58) Field of Classification Search
CPC combination set(s) only.
See application file for complete search history.

(56) References Cited

U.S. PATENT DOCUMENTS

| | | | |
|---|---|---|---|
| 6,574,495 B1* | 6/2003 | Golman | A61K 49/06 600/420 |
| 8,154,284 B2 | 4/2012 | Duckett et al. | |
| 2010/0219826 A1 | 9/2010 | Duckett et al. | |
| 2011/0274626 A1* | 11/2011 | Duckett | A61K 49/10 424/9.361 |

OTHER PUBLICATIONS

Adams et al., Chem. Phys. (2009) 131, 194505.
Adams et al., "Reversible interactions with para-hydrogen enhance NMR sensitivity by polarization transfer," brochure, Science (2009) 323, 1708-1711 The University of Edinburgh.
Albers et al., "Cancer Res." (2008) 68, 8607.
Alei et al., "pH-Dependence of N-15 NMR Shifts and Coupling Constants in Aqueous Imidazole and 1-Methylimidazole—Comments on Estimation of Tautomeric Equilibrium Constants for Aqueous Histidine," J. Am. Chem. Soc. (1980) 102, 2881-2887.
Ardenkjaer-Larsen et al., "Increase in Signal-to-Noise Ratio of >10,000 Times in Liquid-State NMR. Proc.," Natl. Acad. Sci. U. S. A. (2003) 100, 10158-10163.
Atkinson et al., "Spontaneous Transfer of Parahydrogen Derived Spin Order to Pyridine at Low Magnetic Field," J. Am. Chem. Soc. (2009) 131, 13362-13368.
Barskiy et al., "The Feasibility of Formation and Kinetics of NMR Signal Amplification by Reversible Exchange (SABRE) at High Magnetic Field (9.4 T)," J. Am. Chem. Soc. (2014) 136, 3322-3325.
Bhujwalla et al., "Combined Vascular and Extracellular pH Imaging of Solid Tumors," NMR Biomed (2002) 15, 114-119.
Bowers et al., "Parahydrogen and synthesis allow dramatically enhanced nuclear alignment" J. Am Chem Soc. (1987) 109(18):5541-2.
Bowers et al., "Transformation of Symmetrization Order to Nuclear-Spin Magnetization by Chemical-Reaction and Nuclear-Magnetic-Resonance," Phys. Rev. Lett. (1986) 57, 2645-2648.
Brindle et al., Magn. Reson. Med. 2011, 66, 505.
Brunner et al., "Solubility of Hydrogen in 10 Organic Solvents at 298.15-K, 323.15-K, and 373.15-K," J. Chem. Eng. Data (1985) 30, 269-273.
Buljubasich et al., Reson (2012) 219, 33.
Colell et al., Phys. Rev. Lett. (2013) 110, 137602.
Comment et al., "Hyperpolarized Magnetic Resonance as a Sensitive Detector of Metabolic Function," Biochemistry (2014) 53, 7333-7357.
Cowley et al., "Iridium N-Heterocyclic Carbene Complexes as Efficient Catalysts for Magnetization Transfer from Para-Hydrogen," J. Am. Chem. Soc. (2011) 133, 6134-6137.
Day et al., "Detecting Tumor Response to Treatment Using Hyperpolarized C-13 Magnetic Resonance Imaging and Spectroscope" Nat. Med. (2007) 13, 1382-1387.
Ducker et al., "Similarity of SABRE Field Dependence in Chemically Different Substrates," J. Magn Reson (2012) 214, 159-165.
Duckett et. al. Science (2009) vol. 323. No. 5922, pp. 1708-1711.
Eisenschmid et al., "Para Hydrogen Induced Polarization in Hydrogenation Reactions," J. Am. Chem. Soc. (1987) 109, 8089-8091.
Eshuis et al., "Quantitative Trace Analysis of Complex Mixtures Using SABRE Hyperpolarization," Angew. Chem., Int. Ed. (2015) 54, 1481-1484.

(Continued)

Primary Examiner — Michael G. Hartley
Assistant Examiner — Leah H Schlientz
(74) *Attorney, Agent, or Firm* — Michael Best & Friedrich LLP

(57) ABSTRACT

Provided are methods for nuclear spin polarization enhancement via signal amplification by reversible exchange at very low magnetic fields.

21 Claims, 22 Drawing Sheets

(56) References Cited

OTHER PUBLICATIONS

Farcasiu et al., "Labelled Compd. Radiopharm" (2013) 56, 637.
Feng et al. "A Pulsed Injection Parahydrogen Generator and Techniques for Quantifying Enrichment" J. Magn. Reson. (2012) 214, 258-262.
Feng et al., J. Chem. Phys. (2014) 141, 134307.
Franzoni et al. J. Am. Chem. Soc. (2012) 134, 10393.
Gallagher et al., "Magnetic Resonance Imaging of pH in Vivo Using Hyperpolarized C-13-Labelled Bicarbonate Nature" (2008) 453, 940-U73.
Gatenby et al., "Why Do Cancers Have High Aerobic Glycolysis," Nat. Rev. Cancer (2004) 4, 891-899.
Gatzke et al., "Extraordinarily Slow Nuclear-Spin Relaxation in Frozen Laser-Polarized Xe-129" Phys. Rev. Lett. (1993) 70, 690-693.
Gillies et al., A. Ph Imaging. IEEE Eng. Med. Biol. Mag. (2004) 23, 57-64.
Golman et al., "Real-Time Metabolic Imaging," Proc. Natl. Acad. Sci. U. S. A. (2006) 103, 11270-11275.
Golman et al., S. Magn. Reson. Med. (2001) 46,1.
Goodson et al., "Nuclear Magnetic Resonance of Laser-Polarized Noble Gases in Molecules, Materials, and Organisms," J. Magn. Reson. (2002) 155, 157-216.
Hanahan et al., "Hallmarks of Cancer: The Next Generation Cell" (2011) 144, 646-674.
Herskowitz et al., "Solubility in Organic Liquids," J. Chem. Eng. Data (1983) 28, 164-166.
Holmes et al., "The Reaction of an Iridium PNP Complex with Parahydrogen Facilitates Polarisation Transfer without Chemical Change," Dalton Trans. (2015) 44, 1077-1083.
Hovener et al., Anal. Chem. (2014) 86, 1767.
Hovener et al., Nat. Commun. (2013) 4,5.
Jannin et al., Chem. Phys. Lett. (2012) 549, 99.
Jiang et al., ""Hyperpolarized 15N-Pyridine Derivatives as pH-Sensitive MRI Agents,"" Sci. Rep. (2015) 5, 9104.
Keshari et al., "Diabetes" (2014) DOI: 10.2337/db13.
Kiryutin et al., Phys. Chem. (2012) 226, 1343.
Kumagai et al., Tetrahedron (2013) 69, 3896.
Kurhanewicz et al. ""Analysis of Cancer Metabolism by Imaging Hyperpolarized Nuclei: Prospects for Translation to Clinical Research Neoplasia"" (2011) 13, 81-97.
Lloyd et al., Catal. Sci. Tech. (2014) DOI 10.1039/C1034CY00464G.
Lloyd et al., Catal. Sci. Technol. (2014) 4, 3544.
Merritt et al., Proc. Natl. Acad. Sci. U. S. A. (2011) 108, 19084.
Mewis et al., Magn. Reson. Chem. (2014) 52, 358.
Mugler et al., "Hyperpolarized 129 Xe MRI of the Human Lung," J. Magn. Reson. Imaging (2013) 37, 313-331.
Nelson et al., "Metabolic Imaging of Patients with Prostate Cancer Using Hyperpolarized 1-C-13 Pyruvate," Sci. Transl. Med. (2013) 5, 198ra108.
Nikolaou et al., "NMR Hyperpolarization Techniques for Biomedicine," Chem. Eur. J. (2015) 21, 3156-3166.
Nonaka et al., Nat. Commun. (2013) 4,2411.
Oppenheimer et al. LabelledComp. Radiopharm. (1978) 15, 191.
Pople et al., Canadian Journal of Chemistry (1957) 35, 1060-1072.
Pravdivtsev et al., Phys. Chem. (2013) 14, 3327.
Pravdivtsev et al., Phys. Chem. (2014) 16, 24672.
Radhakrishnan et al., "Solubility of Hydrogen in Methanol, Nitrobenzene, and Their Mixtures—Experimental Data and Correlation," J. Chem. Eng. Data (1983) 28, 1-4.
Reineri et al. Am. Chem. Soc. (2008) 130, 15047.
Schippers et al., Labelled Comp. Radiopharm. (2006) 49, 305.
Shchepin et al., "Hyperpolarization of "Neat" Liquids by NMR Signal Amplification by Reversible Exchange," article (2015) pp. 1961-1967, The Journal of Physical Chemistry Letters.
Shi et al., "Heterogeneous Solution NMR Signal Amplification by Reversible Exchange," Angew. Chem., Int. Ed. (2014) 53, 7495-7498.
Shi et al., "Nanoscale Catalysts for NMR Signal Enhancement by Reversible Exchange," J. Phys. Chem. C (2015) 119, 7525-7533.
Theis et al., "Light-SABRE Enables Efficient in-Magnet Catalytic Hyperpolarization," J. Magn. Reson. (2014) 248, 23-26.
Theis et al., "Microtesla SABRE Enables 10% Nitrogen-15 Nuclear Spin Polarization," J. Am. Chem. Soc. (2015) 137, 1404-1407.
Theis et al., Am. Chem. Soc. (2012) 134, 3987.
Theis et al., Chem. Phys. (2014) 140, 014201.
Theis et al., Nat. Phys. (2011) 7, 571.
Thomas et al., J. Am. Chem. Soc. (2015) 137 (4) pages 1404-1407.
Thruong et al., "15N Hyperpolarization by Reversible Exchange Using SABRE-Sheath," J. Phys. Chem. C (2015) 119, 8786-8797.
Thruong et al., "Irreversible Catalyst Activation Enables Hyperpolarization and Water Solubility for NMR Signal Amplification by Reversible Exchange," J. Phys. Chem. B (2014) 18, 13882-13889.
Turschmann et al., Phys. Chem. Chem. Phys. (2014) 16, 15411.
Van Weerdenburg, "Ligand Effects of NHC-Iridium Catalysts for Signal Amplification by Reversible Exchange (SABRE)," Chem. Commun. (2013) 49, 7388-7390.
Vazquez-Serrano et al., "The Search for New Hydrogenation Catalyst Motifs Based on N-Heterocyclic Carbene Ligands," Inorg. Chim. Acta (2006) 359, 2786-2797.
Whaley et al., Labelled Compd. Radiopharm (1974) 10, 283.
Zeng et al., J. Magn. Reson. (2013) 237, 73.
Zhivonitko et al., "Strong 31P Nuclear Spin Hyperpolarization Produced via Reversible Chemical Interaction with Parahydrogen," Chem. Commun. (2015) 51, 2506-2509.

* cited by examiner

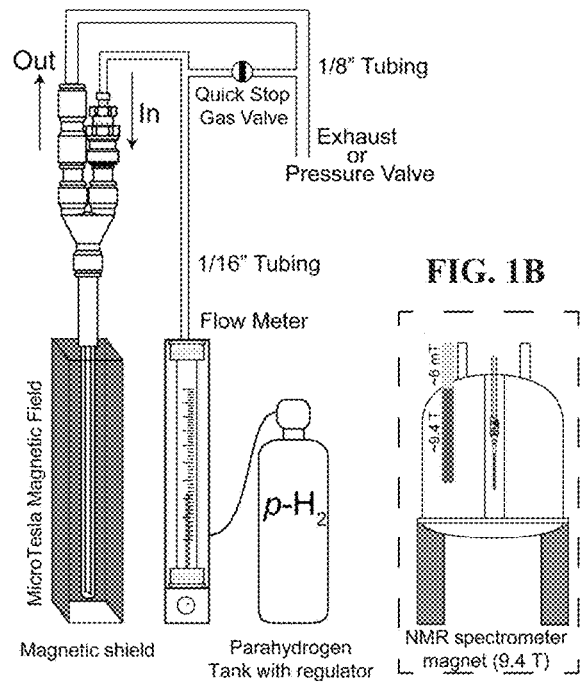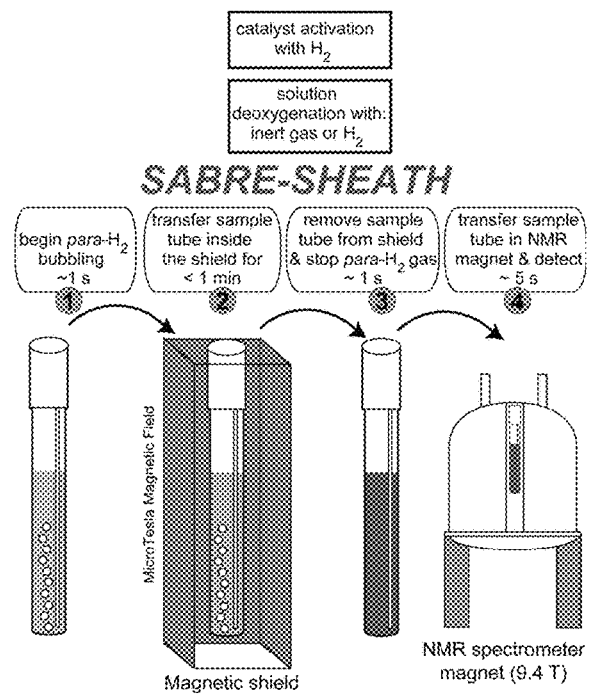
FIG. 1A  FIG. 1B  FIG. 1C

Generalized AA'BB' spin system $\nu_A = \nu_{A'} \quad \nu_B = \nu_{B'}$

AA'BB' spin system formed by two Ir-hydride protons and by two $^{15}N$ sites of two exchangeable $^{15}N$-pyridines FIG. 4A
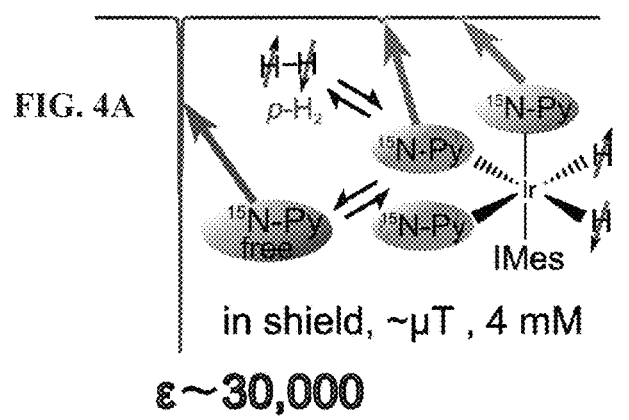
in shield, ~μT, 4 mM
ε ~ 30,000
FIG. 4C
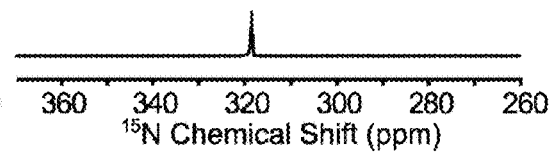
neat 12.5 M
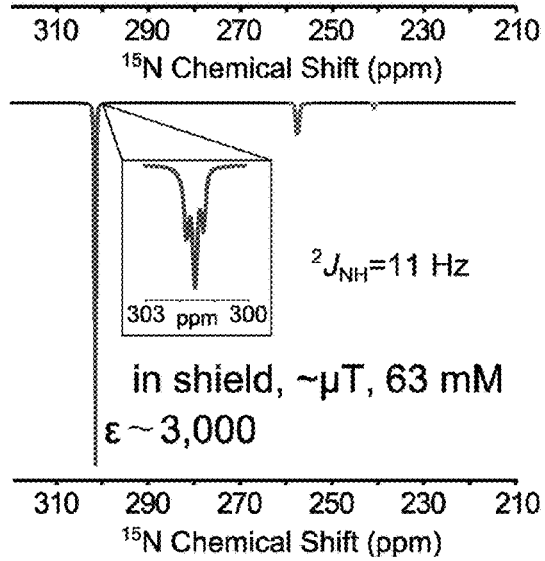
$^2J_{NH}$ = 11 Hz
in shield, ~μT, 63 mM
ε ~ 3,000
FIG. 4B
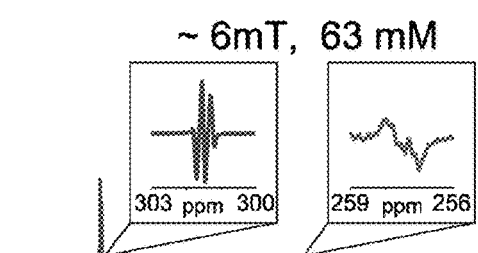
~ 6mT, 63 mM
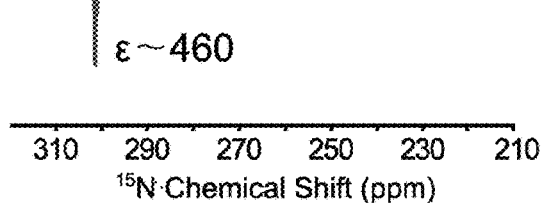
ε ~ 460
FIG. 4D

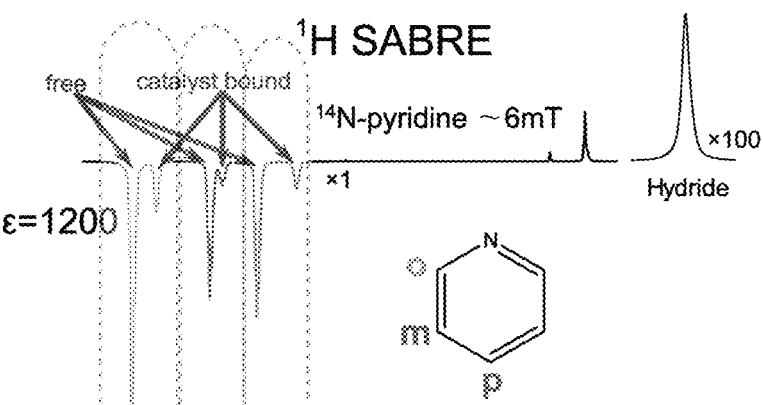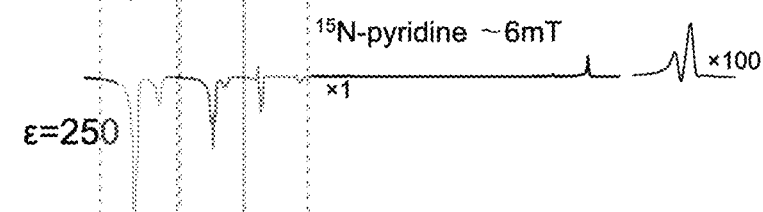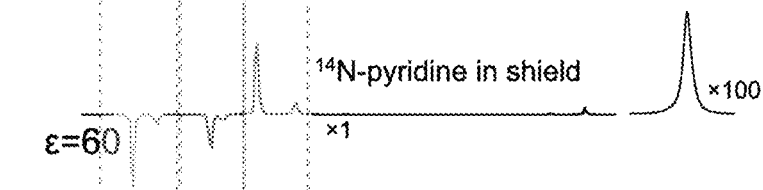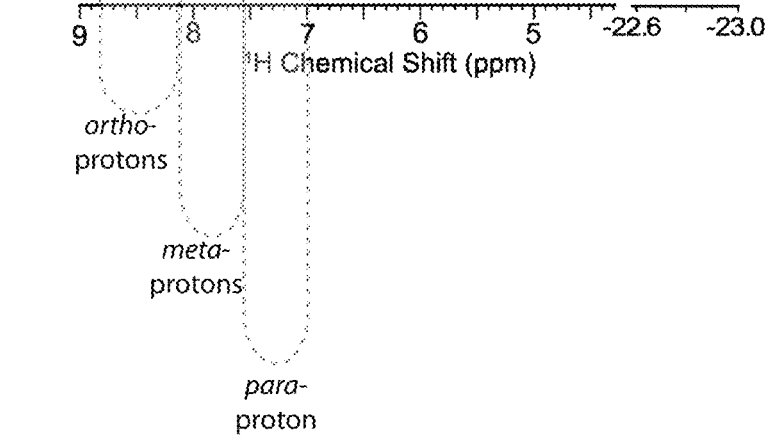
FIG. 5A
FIG. 5B
FIG. 5C
FIG. 5D

FIG. 7A
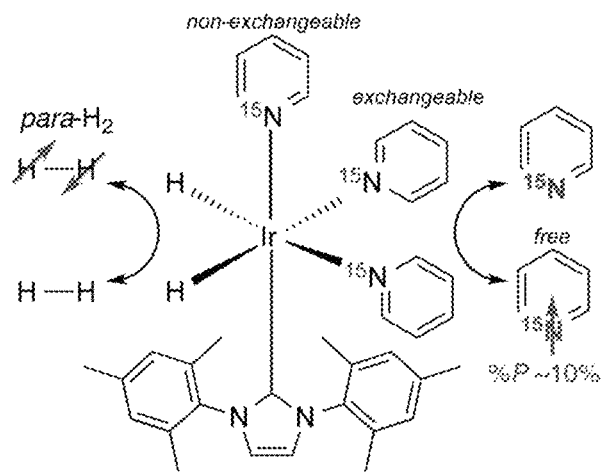
FIG. 7B
FIG. 7C
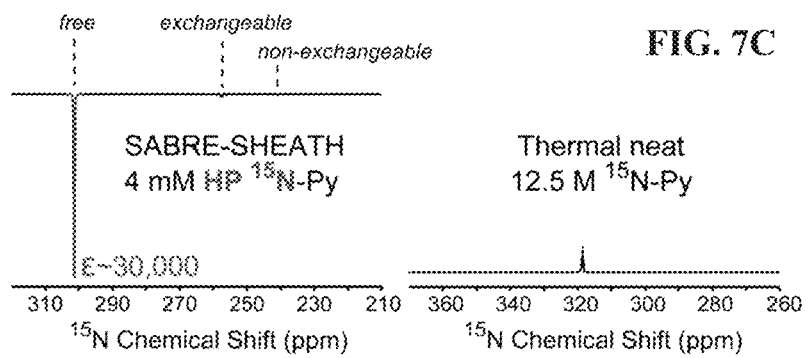
FIG. 7D
FIG. 7E
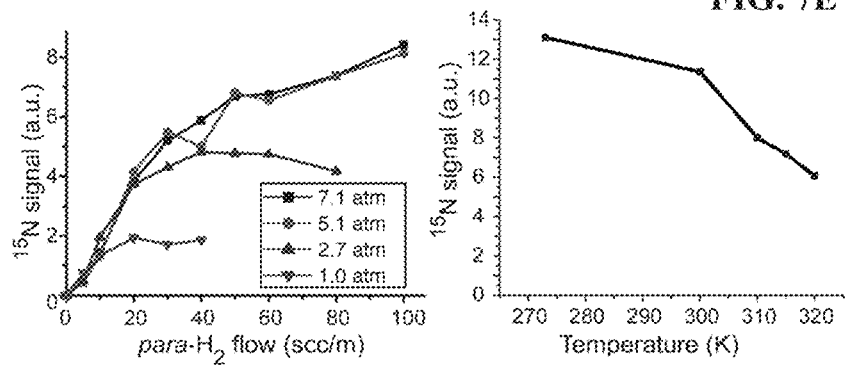
FIG. 7F
$^{15}N\ T_1$ of $^{15}N$-Py
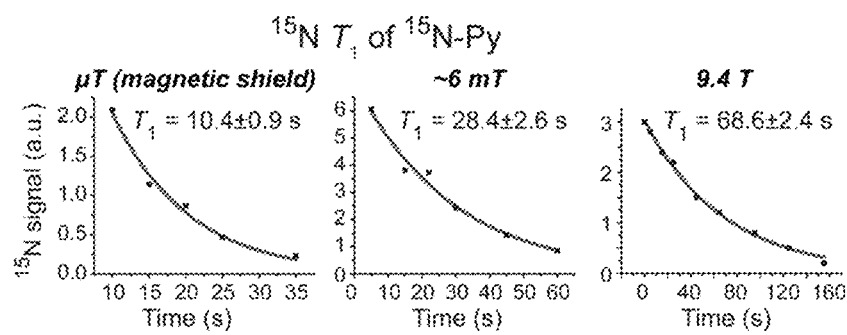

Nitrogen-15
FIG. 9A µT-field SABRE
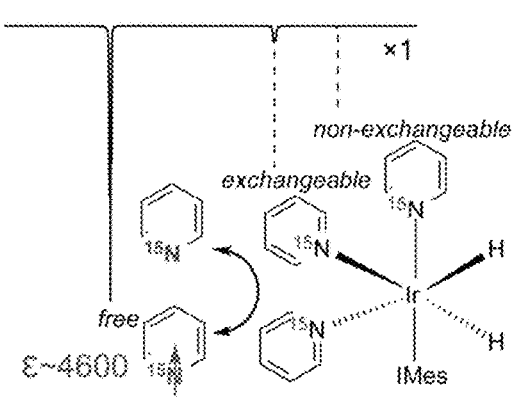
FIG. 9B Low-field SABRE
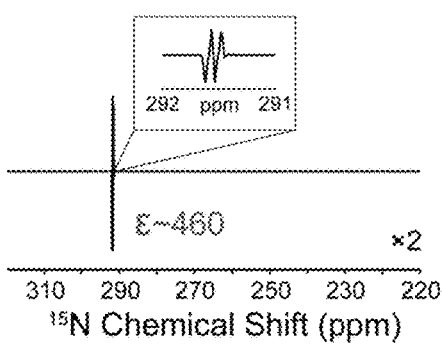
FIG. 9C ¹⁵N Thermal Reference
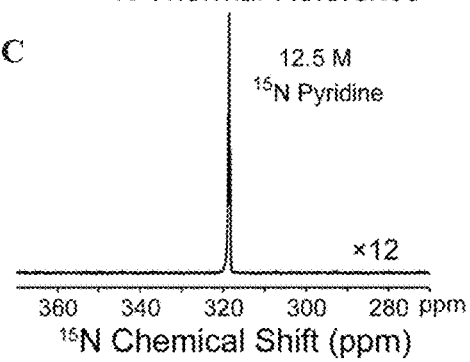
¹⁵N Chemical Shift (ppm)
Carbon-13
FIG. 9D µT-field SABRE
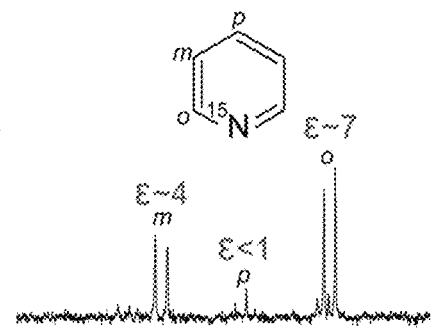
FIG. 9E Low-field SABRE
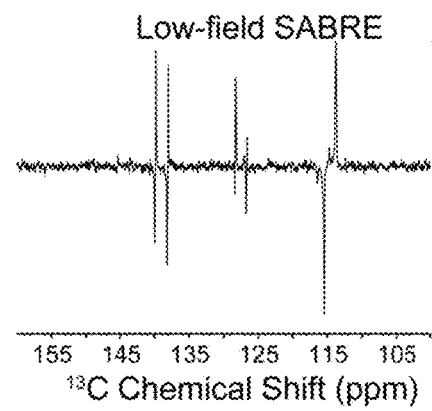
FIG. 9F ¹³C Thermal Reference
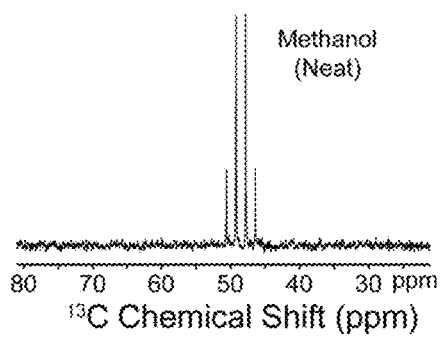
¹³C Chemical Shift (ppm)

FIG. 16A
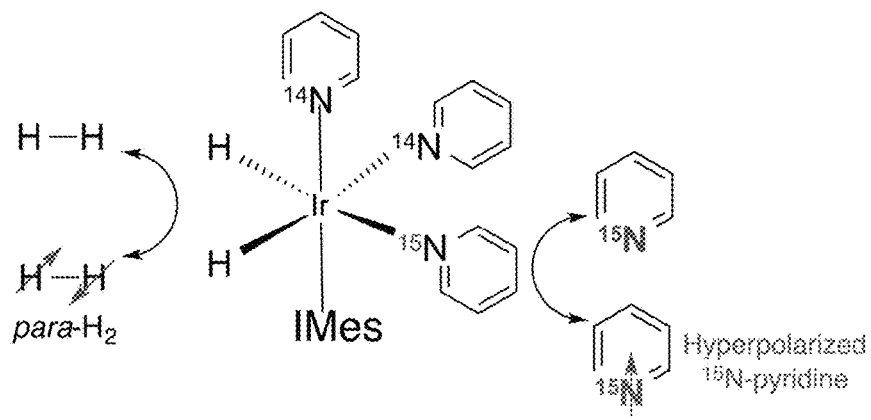
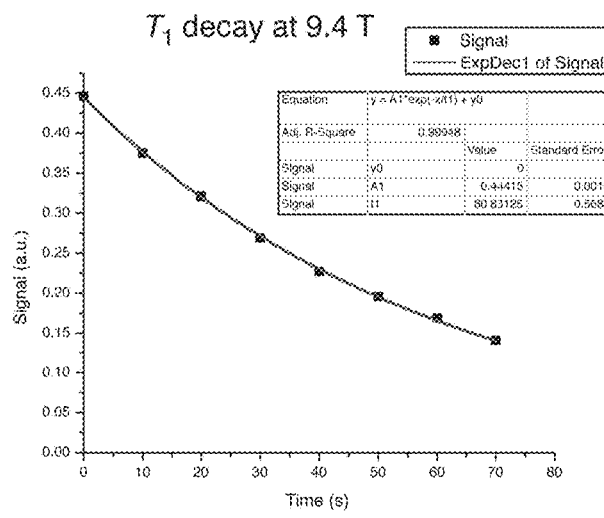
FIG. 16B
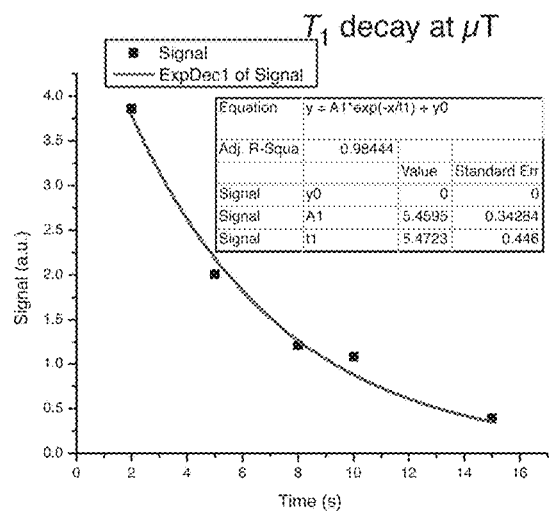
FIG. 16C

FIG. 17A
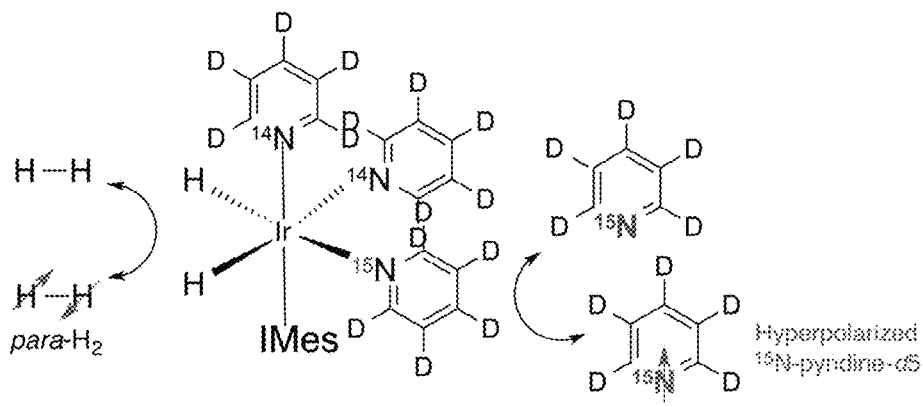
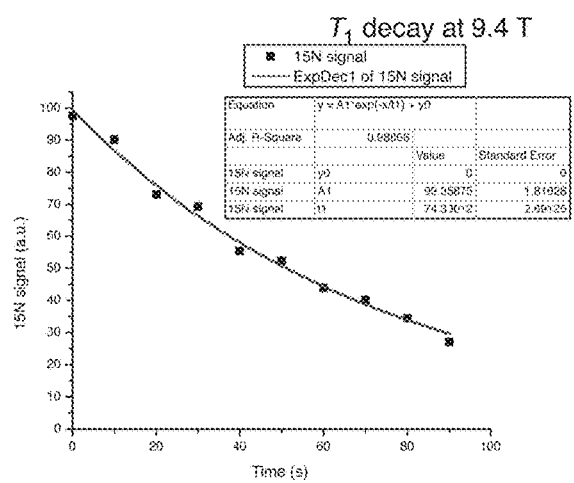
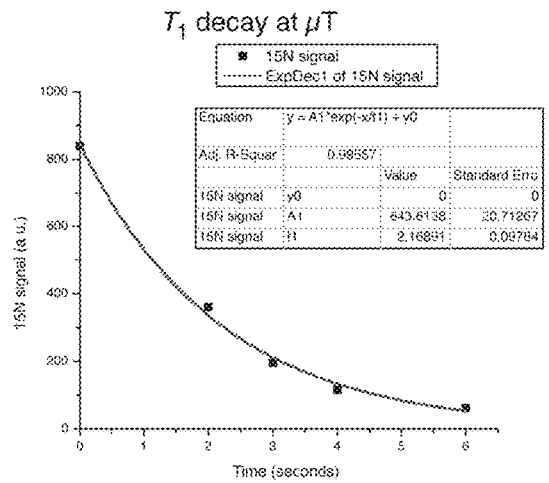
FIG. 17B
FIG. 17C

FIG. 18A
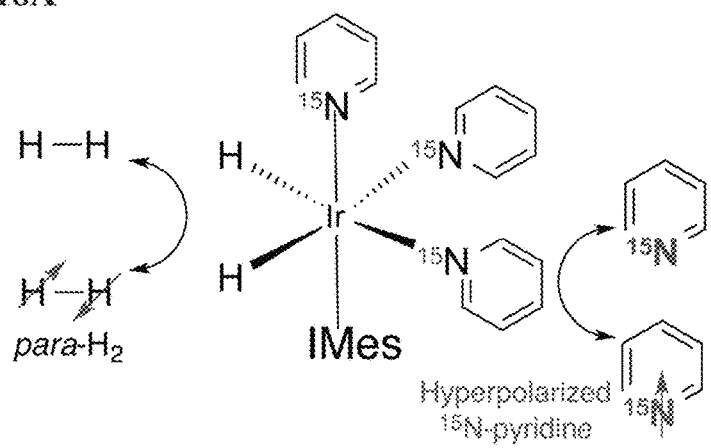
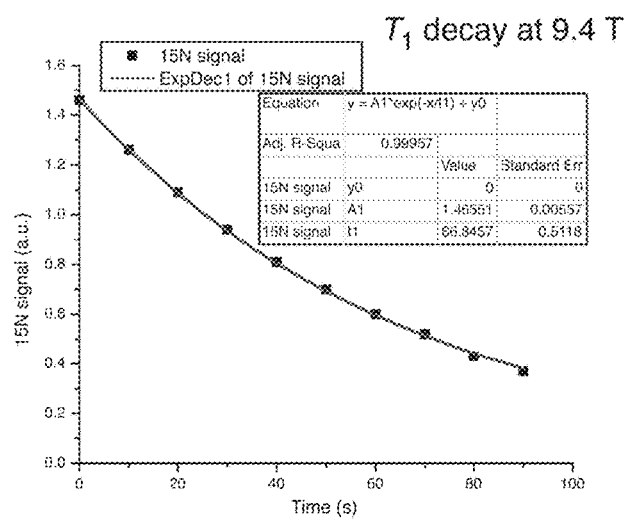
FIG. 18B
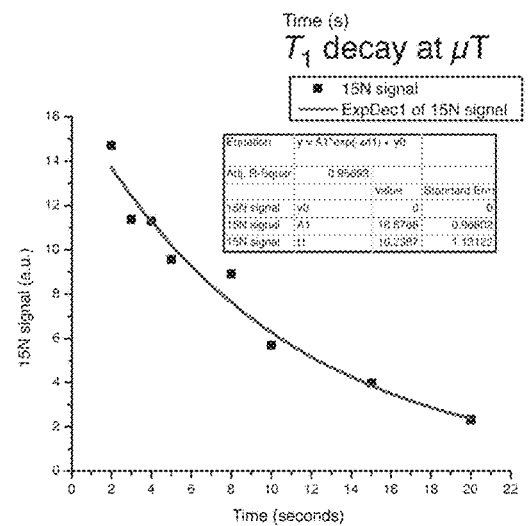
FIG. 18C

FIG. 19A
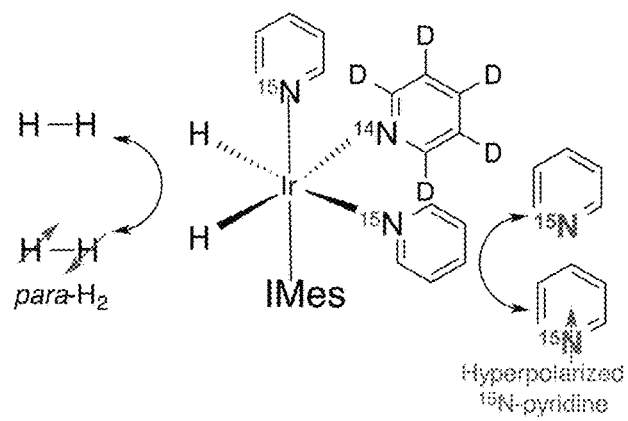
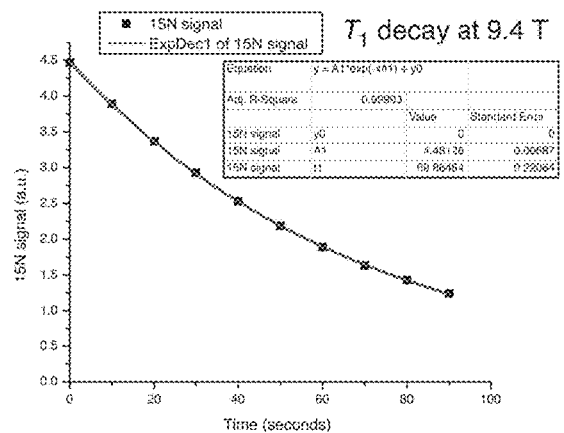
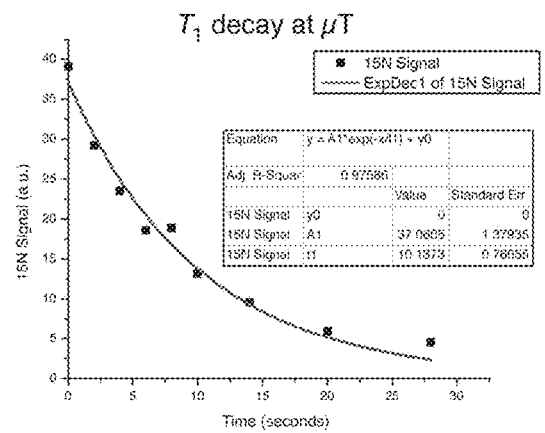
FIG. 19B          FIG. 19C

FIG. 20A
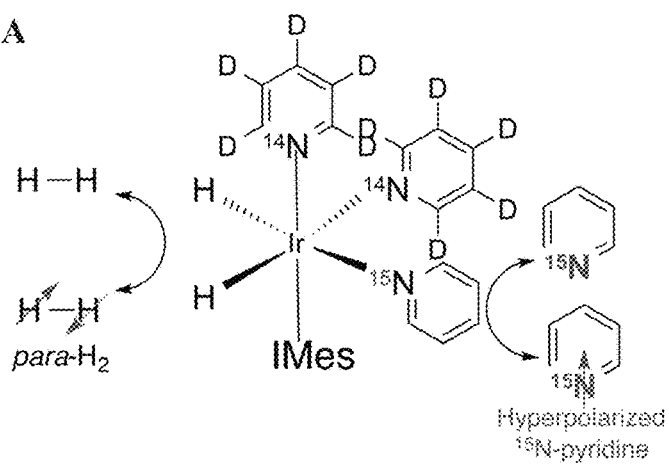
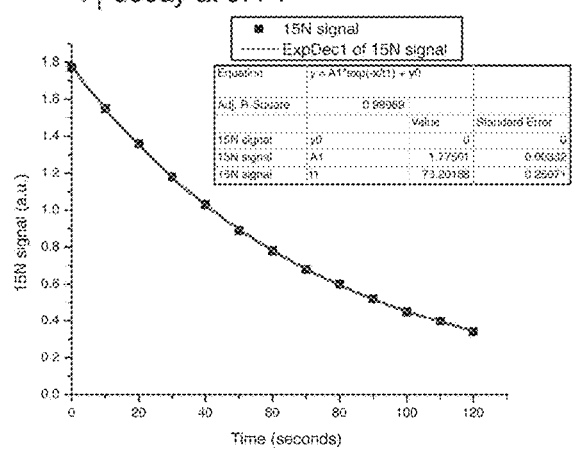
FIG. 20B
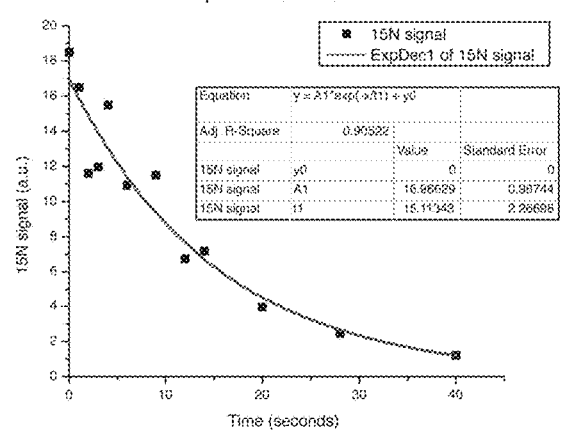
FIG. 20C

FIG. 21A
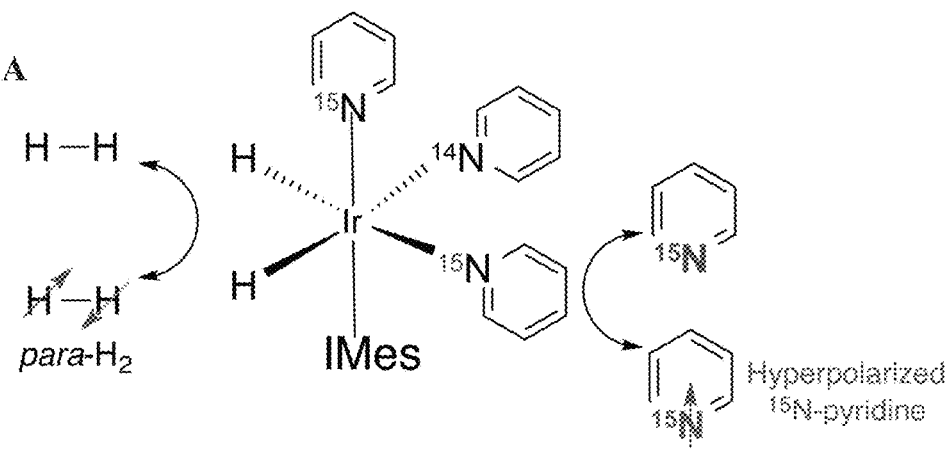
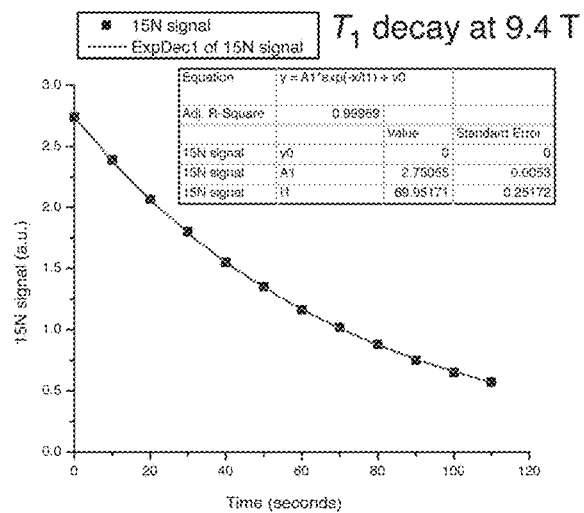
FIG. 21B
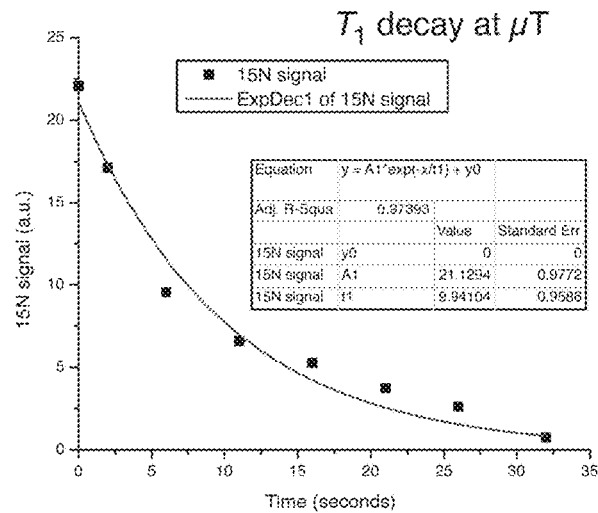
FIG. 21C

FIG. 22A
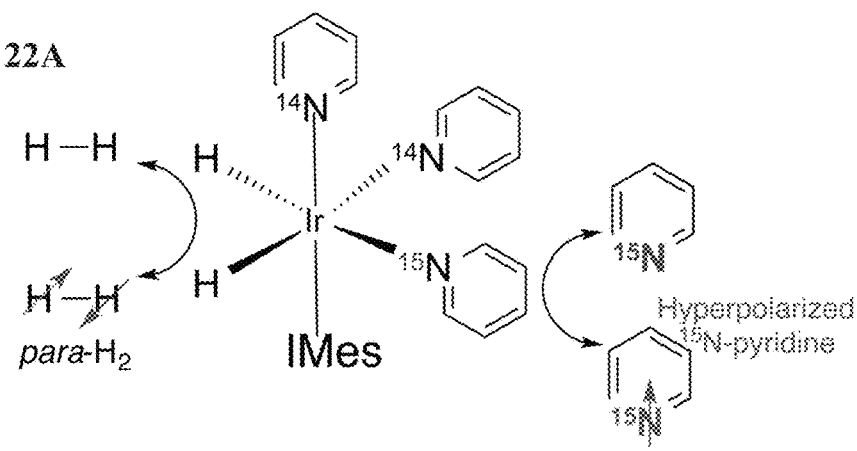
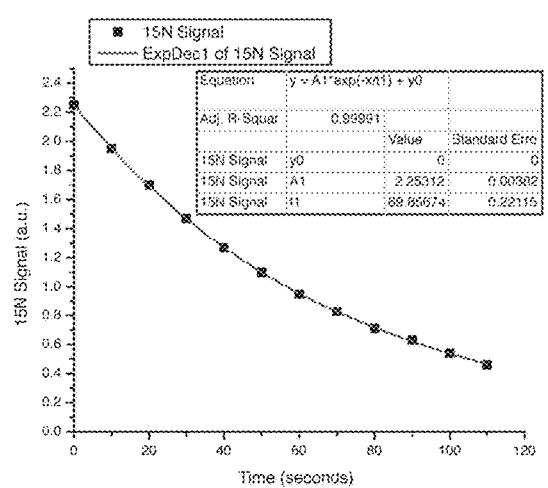
FIG. 22B
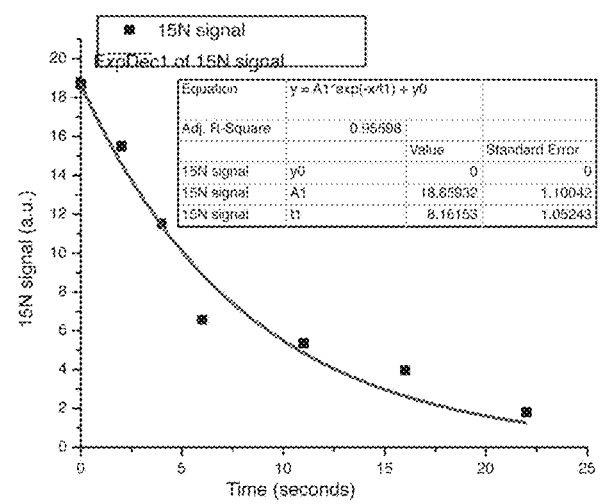
FIG. 22C

US 11,156,684 B2

METHOD FOR CREATING HYPERPOLARIZATION AT MICROTESLA MAGNETIC FIELDS

CROSS REFERENCE TO RELATED APPLICATIONS

This application claims priority to U.S. Provisional Application No. 62/069,542, filed Oct. 28, 2014, which is herein incorporated by reference in its entirety.

STATEMENT OF GOVERNMENT INTEREST

This invention was made with government support under Awards No. CHE-1363008, CHE-1416268 and CHE-1416432 awarded by the National Science Foundation; Award No. 1R21EB018014 by the National Institute of Health; and Award No. W81WH-12-1-0159/BC112431 by the Department of Defense. The Government has certain rights in the invention.

TECHNICAL FIELD

The present disclosure relates to methods for nuclear spin polarization enhancement at very low magnetic fields (e.g., significantly lower than magnetic field of Earth of 50 microTesla) via signal amplification by reversible exchange.

BACKGROUND

Nuclear magnetic resonance (NMR) and magnetic resonance imaging (MM) sensitivity can be enhanced through hyperpolarization by temporarily increasing the relatively low nuclear spin polarization ($P=10^{-6}-10^{-5}$)—in some cases approaching unity—effectively providing $10^4$-$10^5$-fold NMR signal enhancement. Despite the short-lived nature of hyperpolarized (HP) spin states, with typical lifetimes on the order of seconds for $^1H$ or minutes for heteronuclei (e.g., $^{15}N$, $^{13}C$), the considerable sensitivity gain has led to many biomedical applications where a given HP compound serves as injectable or inhalable contrast agent.

Current hyperpolarization methods for preparation of HP contrast agents include dissolution dynamic nuclear polarization (d-DNP). However, d-DNP is expensive, complex and not easily scalable. Another route to address the NMR/MRI sensitivity problem is the use of parahydrogen (abbreviated here as p-$H_2$ or para-$H_2$) as the hyperpolarization source, as is done in a family of techniques referred to collectively as Parahydrogen-Induced Polarization (PHIP). In traditional PHIP, molecular precursors with unsaturated chemical bonds are hydrogenated via molecular addition of para-$H_2$, thereby transferring the nuclear spin order to the molecular products. HP $^{13}C$ molecules produced by this approach have been efficiently used as HP contrast agents in vivo.

In a more recent technique known as Signal Amplification by Reversible Exchange (SABRE), spin order may be transferred from para-$H_2$ to target molecules during the lifetime of transient molecular complexes without permanent chemical change. SABRE generally uses an organometallic catalyst to transiently co-locate para-$H_2$ and the target substrate molecule in a low-symmetry complex in solution. In low field (e.g., 5-7 mT), net spin order can be transferred from the para-$H_2$ to the spins of the substrate via scalar couplings. However, achieving efficient hyperpolarization via SABRE has been limited to protons, which depolarize quickly ($T_1$ of seconds), precluding metabolic tracking on biologically relevant timescales. It also presents background issues from water. Heteronuclei such as $^{15}N$ are much more attractive for hyperpolarization because they often have long polarization lifetimes or singlet population relaxation times ($T_S$) in special cases exceeding ten minutes. SABRE derived proton hyperpolarization can be transferred to heteronuclei, but the associated efficiency is low, producing only ~0.03% polarization. Accordingly, there exists a need for methods of hyperpolarization of heteronuclei.

SUMMARY

In one aspect, disclosed is a method of hyperpolarizing heteronuclei, the method comprising: (a) combining para-hydrogen, a compound comprising at least one hyperpolarizable heteronucleus, and a catalyst to form a mixture; and (b) applying a magnetic field with a strength of less than 50 $\mu T$ to the mixture, thereby transferring the spin order from parahydrogen to the at least one hyperpolarizable heteronucleus.

Other aspects of the present disclosure include methods of performing NMR experiments, methods of obtaining MRI images, and other methods of in vivo imaging.

BRIEF DESCRIPTION OF THE DRAWINGS

FIG. 1A, FIG. 1B, and FIG. 1C is a diagram of the experimental setup for SABRE-SHEATH using a 5 mm NMR tube and the magnetic shield; para-$H_2$ gas is supplied from a pressurized tank, regulated (via a flow meter), and bubbled through 1/16 in. tubing placed inside the 5 mm NMR tube under 1-7 atm para-$H_2$ pressure. "Used" para-$H_2$ gas leaves the NMR sample via an exhaust line. FIG. 1B is a diagram of in situ SABRE (9.4 T) and low-field (ex situ) SABRE performed using a 9.4 T NMR magnet and within its fringe field, respectively. All NMR detection was performed at 9.4 T. FIG. 1C shows the sequence of events for SABRE-SHEATH hyperpolarization.

FIG. 3B shows hyperpolarization transfer dictated by eq 5a. Here, the off-diagonal elements, $-\Delta J_{AB}/2$, are real and negative (isomorphic with $-\sigma_x$); hence, this part of the Hamiltonian is depicted along $-x$. The initial population of $|S^A S^B\rangle$ on the diagonal is represented by a vector along $+z$. This is then rotated by the J-coupling term into a vector along $-z$ representing population of the targeted state $|T_-T_+\rangle$. FIG. 3C shows hyperpolarization transfer dictated by eq 5b according to the same principles: Initial $|S_0 T_-\rangle$ population on the diagonal along $+z$ is rotated into a population of $|T_- S_0\rangle$ along $-z$ by a Hamiltonian with real and positive off-diagonal elements, $\Delta J_{AB}/2$, represented along $+x$. In the diagrams, initial and final states are represented by the most faded and most solid vectors, respectively.

FIGS. 4A, 4B, 4C, and 4D depict single-shot $^{15}N$-NMR spectra from $^{15}N$-pyridine ($^{15}N$-Py) SABRE experiments. FIG. 4A shows a SABRE-SHEATH experiment with Ir-catalyst/$^{15}$N-Py concentrations of 0.24 mM and 4 mM respectively. Detected 30,000-fold signal enhancement corresponds to ~10% polarization. FIG. 4B shows that increase of Ir-catalyst/$^{15}$N-Py concentrations results in the absolute NMR signal amplification, but relative enhancement and polarization levels decrease. An in-phase triplet split by 11 Hz is found, in both, 4A and 4B. FIG. 4C shows that when attempting $^{15}$N SABRE at the conditions optimized for proton hyperpolarization (6±4 mT) an anti-phase triplet with lower enhancement is observed.

FIGS. 5A, 5B, 5C AND 5D show $^1$H-NMR spectra obtained via SABRE from $^{14}$N-Py vs. $^{15}$N-Py experiments. SABRE polarization was conducted in both the ~6±4 mT field (FIGS. 5A and 5B) and in the shield (FIGS. 5C and 5D) for $^{14}$N-Py vs. $^{15}$N-Py at 63 mM Py and 6.3 mM catalyst concentrations. $^1$H-SABRE enhancement levels are shown for the ortho-proton of Py (~8.5 ppm) of each spectrum. Additionally, the hydride region (~−22.8 ppm) is shown, highlighting the significant difference in line shape between $^{15}$N-Py and $^{14}$N-Py: a sharp singlet of $^{14}$N-Py vs. anti-phase resonance of $^{15}$N-Py.

FIG. 6C shows an NMR spectrum of $^{15}$N-Py ($\varepsilon_{free}$~300) sample corresponding to completely activated catalyst solution (as validated by $^1$H NMR using conventional low-field SABRE through achieving efficient enhancement of Py proton polarization, and also validated through in situ detection of the disappearance of SABRE hyperpolarized Ir-hydride intermediate species). FIG. 6D shows an $^{15}$N NMR spectrum of a $^{15}$N-Py sample corresponding to maximum SABRE-SHEATH signal intensity ($\varepsilon_{free}$~3600) achieved with ~20 min of para-H$_2$ bubbling (with a ~20% duty cycle, para-H$_2$ bubbling at this step was used for sample-degassing purposes; actual para-H$_2$ bubbling for SABRE-SHEATH was only ~30 s) after acquisition of the spectrum shown in FIG. 6C (but with the same para-H$_2$ bubbling time of ~30 s for SABRE-SHEATH hyperpolarization). FIG. 6E shows an $^{15}$N NMR spectrum ($\varepsilon_{free}$≈185) of $^{15}$N-Py sample after it was exposed to air; the spectrum is recorded ~23 min after spectrum shown in FIG. 6C. FIG. 6F shows an $^{15}$N NMR spectrum of $^{15}$N-Py sample after SABRE-SHEATH intensities ($\varepsilon_{free}$≈3600) fully recovered from exposure to air; the spectrum was recorded ~31 min after the spectrum shown in FIG. 6C.

FIG. 7A shows a schematic of SABRE showing $^{15}$N-Py and para-H$_2$ exchange on the activated Ir-IMes catalyst producing efficient $^{15}$N hyperpolarization. FIG. 7B is an $^{15}$N NMR spectrum of HP 4 mM $^{15}$N-Py (0.24 mM catalyst) via SABRE-SHEATH procedure using ~6 atm of para-H$_2$ pressure. FIG. 7C shows the corresponding $^{15}$N reference signal from neat $^{15}$N-Py. FIG. 7D is a graph depicting $^{15}$N SABRE-SHEATH signal dependence on the para-H$_2$ flow rate (sccm) at various para-H$_2$ pressures: 1.0, 2.7, 5.1, and 7.1 atm. The data acquired in FIG. 7D utilized [catalyst]/[$^{15}$N-Py]=4 mM/96 mM. FIG. 7E is a graph depicting $^{15}$N SABRE-SHEATH signal dependence on temperature at ~6 atm para-H$_2$ pressure. The data acquired in FIG. 7E utilized [catalyst]/[$^{15}$N-Py]=2 mM/48 mM. FIG. 7F is a series of graphs depicting $^{15}$N T$_1$ measurements at three different magnetic field strengths: T regime ([catalyst]/[$^{15}$N-Py]=0.2 mM/20 mM) in the magnetic shield, ~6 mT fringe field ([catalyst]/[$^{15}$N-Py]=6 mM/63 mM), and 9.4 T ([catalyst]/[$^{15}$N-Py]=0.2 mM/20 mM) field inside the NMR spectrometer.

FIGS. 8A and 8E depict a dilution series corresponding to ~1:16 catalyst to $^{15}$N-Py ratio. FIGS. 8B and 8F depict a series of catalyst/$^{15}$N-Py solutions with fixed catalyst concentration. FIGS. 8C and 8D depict a series of catalyst/$^{15}$N-Py solutions with fixed $^{15}$N-Py concentrations at 100 mM and 20 mM.

FIGS. 9A, 9B, 9C, 9D, 9E and 9F depict a series of NMR spectra comparing $^{13}$C and $^{15}$N SABRE signal enhancements. FIG. 9A depicts $^{15}$N SABRE using SABRE-SHEATH at T field. FIG. 9B depicts $^{15}$N SABRE using SABRE-SHEATH at ~6 mT for a 63 mM $^{15}$N-Py sample with 6 mM of Ir-IMes catalyst. FIG. 9C shows a thermally polarized reference spectrum of 12.5 M $^{15}$N-Py used as the polarization enhancement reference for $^{15}$N SABRE. The intensity scale for the spectrum corresponding to the conventional (low-field) SABRE at ~6 mT (shown in 9B) is zoomed in to twice the level of the T SABRE $^{15}$N spectrum (shown in 9A), while the $^{15}$N-Py reference spectrum (shown in 9C) is zoomed in 12-fold. FIG. 9D shows $^{13}$C SABRE conducted on the same sample at T field and FIG. 9E shows $^{13}$C SABRE at ~6 mT. FIG. 9F shows the $^{13}$C polarization/signal reference in neat methanol (24 M at ~1.1% natural abundance of $^{13}$C). All of the $^{13}$C SABRE spectra are plotted on the same intensity scale. The polarization enhancements (ε) for selected peaks are shown for their respective spectra.

FIG. 11A depicts a $^{15}$N SABRE-SHEATH hyperpolarized spectrum and the corresponding thermally polarized reference spectrum after 192 signal averages. FIG. 11B depicts a $^1$H SABRE spectrum of a hyperpolarized sample in a milliTesla magnetic field (~6 mT) and the corresponding NMR spectrum using a thermally polarized sample. FIG. 11C depicts the effect of the para-H$_2$ flow rate (measured in standard cubic centimeters per minute or sccm) on $^{15}$N signal enhancement at ~90 mM catalyst concentration under five para-H$_2$ pressure values. FIG. 11D depicts the effect of [Py] to [catalyst] ratio on $^{15}$N signal enhancement using 120 sccm flow rate under ~7 atm of para-H$_2$ pressure. FIG. 11E depicts the $^{15}$N SABRE-SHEATH dependence (modeled as exponential decay) as a function of the sample exposure to the microTesla magnetic field after stopping para-H$_2$ bubbling time. FIG. 11F depicts the $^{15}$N T$_1$ decay at 9.4 T. The experiments in panels E and F are conducted using ~90 mM catalyst concentration (~140:1 [Py] to [catalyst] ratio) at 120 sccm flow rate and ~7 atm para-H$_2$ pressure.

FIG. 16A is a chemical structure depicting the most probable Ir-catalyst complex and the exchange of para-$H_2$ and Py substrate when catalyst is activated with n.a. Py in a SABRE-SHEATH experiment. FIG. 16C shows the decay and fitting model of $^{15}N$ signal detected at 9.4 T as a function of sample exposure time to microTesla magnetic field of the shield after stopping para-$H_2$ flow. FIG. 16B shows $^{15}N$ $T_1$ decay of hyperpolarized signal measured at 9.4 T using small degree (~7°) excitation RF pulse.

FIG. 17A is a chemical structure depicting the most probable Ir-catalyst complex (from the perspective relevant to $^{15}N$ SABRE-SHEATH hyperpolarization process) and the exchange of para-$H_2$ and Py-$d$ substrate. The catalyst is activated with natural Py-$d_5$ (99.5% deuterium enrichment) and natural abundance level of $^{15}N$. FIG. 17B shows $^{15}N$ $T_1$ decay of hyperpolarized signal measured at 9.4 T using small degree (~7°) excitation RF pulse. FIG. 17C shows the decay and fitting model of $^{15}N$ signal detected at 9.4 T as a function of sample exposure time to microTesla magnetic field of the shield after stopping para-$H_2$ flow.

FIG. 18A is a chemical structure depicting the most probable Ir-catalyst complex (from the perspective relevant to $^{15}N$ SABRE-SHEATH hyperpolarization process) and the exchange of para-$H_2$ and $^{15}N$ enriched (99% $^{15}N$) $^{15}N$-Py substrate. The catalyst is activated with $^{15}N$-Py. FIG. 18B shows the $^{15}N$ $T_1$ decay of hyperpolarized signal measured at 9.4 T using small degree (~7°) excitation RF pulse. FIG. 18C shows the decay and fitting model of $^{15}N$ signal detected at 9.4 T as a function of sample exposure time to microTesla magnetic field of the shield after stopping para-$H_2$ flow.

FIG. 19A is a chemical structure depicting the most probable Ir-catalyst complex (from the perspective relevant to $^{15}N$ SABRE-SHEATH hyperpolarization process) and the exchange of para-$H_2$ and $^{15}N$-Py/Py-$d_5$ substrates. The catalyst is activated with $^{15}N$-Py, which is reflected in the occupant of nonexchangeable (axial) ligand position. FIG. 19B shows the $^{15}N$ $T_1$ decay of hyperpolarized signal measured at 9.4 T using small degree (~7°) excitation RF pulse. FIG. 19C shows the decay and fitting model of $^{15}N$ signal detected at 9.4 T as a function of sample exposure time to microTesla magnetic field of the shield after stopping para-$H_2$ flow.

FIG. 20A is a chemical structure depicting the most probable Ir-catalyst complex (from the perspective relevant to $^{15}N$ SABRE-SHEATH hyperpolarization process) and the exchange of para-$H_2$ and $^{15}N$-Py/Py-$d_5$ substrates. FIG. 20B shows the $^{15}N$ $T_1$ decay of hyperpolarized signal measured at 9.4 T using small degree (~7°) excitation RF pulse. FIG. 20C shows the decay and fitting model of $^{15}N$ signal detected at 9.4 T as a function of sample exposure time to microTesla magnetic field of the shield after stopping para-$H_2$ flow.

FIG. 21A is a chemical structure depicting the most probable Ir-catalyst complex (from the perspective relevant to $^{15}N$ SABRE-SHEATH hyperpolarization process) and the exchange of para-$H_2$ and $^{15}N$-Py/n.a. Py substrates. FIG. 21B shows the $^{15}N$ $T_1$ decay of hyperpolarized signal measured at 9.4 T using small degree (~7°) excitation RF pulse. FIG. 21C shows the decay and fitting model of $^{15}N$ signal detected at 9.4 T as a function of sample exposure time to microTesla magnetic field of the shield after stopping para-$H_2$ flow.

FIG. 22A is a chemical structure depicting the most probable Ir-catalyst complex (from the perspective relevant to $^{15}N$ SABRE-SHEATH hyperpolarization process) and the exchange of para-$H_2$ and $^{15}N$-Py/n.a. Py substrates. The catalyst is activated with n.a. Py, which is reflected in the occupant of nonexchangeable (axial) ligand position. FIG. 22B shows the $^{15}N$ $T_1$ decay of hyperpolarized signal measured at 9.4 T using small degree (~7°) excitation RF pulse. FIG. 22C shows the decay and fitting model of $^{15}N$ signal detected at 9.4 T as a function of sample exposure time to microTesla magnetic field of the shield after stopping para-$H_2$ flow.

DETAILED DESCRIPTION

Figure 2A:
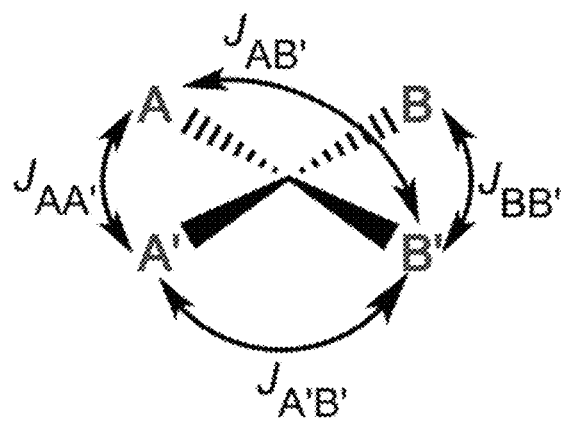
FIG. 2A is a generalized representation of AA'BB' showing relevant spin-spin couplings.

Disclosed herein is a method of directly transferring para-$H_2$ polarization to heteronuclei, using extremely low magnetic fields (on the order of a microTesla), without the need of rf irradiation or pulses. This hyperpolarization strategy may be referred to as SABRE-SHEATH (SABRE in SHield Enables Alignment Transfer to Heteronuclei). The methods include using transition metal catalysts for nuclear spin polarization enhancement in neat liquids via SABRE-SHEATH.

The methods offer significant advantages over existing methods of hyperpolarization of heteronuclei, including the ability to perform the experiments on a shorter timescale with greater polarization and signal enhancement. For example, the disclosed methods demonstrate up to 10% polarization directly on $^{15}N$, corresponding to signal gains of 30,000 fold at 9.4 T.

The advantages of the disclosed method promote the broad applicability of SABRE-SHEATH in biophysical and biomedical imaging experiments, allowing this technique to be useful, for example, in minimally invasive biomedical applications.

1. Definitions

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present invention. All publications, patent applications, patents and other references mentioned herein are incorporated by reference in their entirety. The materials, methods, and examples disclosed herein are illustrative only and not intended to be limiting.

The terms "comprise(s)," "include(s)," "having," "has," "can," "contain(s)," and variants thereof, as used herein, are intended to be open-ended transitional phrases, terms, or words that do not preclude the possibility of additional acts or structures. The singular forms "a," "an" and "the" include plural references unless the context clearly dictates otherwise. The present disclosure also contemplates other embodiments "comprising," "consisting of" and "consisting essentially of," the embodiments or elements presented herein, whether explicitly set forth or not.

The conjunctive term "or" includes any and all combinations of one or more listed elements associated by the conjunctive term. For example, the phrase "an apparatus comprising A or B" may refer to an apparatus including A where B is not present, an apparatus including B where A is not present, or an apparatus where both A and B are present. The phrases "at least one of A, B, . . . and N" or "at least one of A, B, . . . N, or combinations thereof" are defined in the broadest sense to mean one or more elements selected from the group comprising A, B, . . . and N, that is to say, any combination of one or more of the elements A, B, . . . or N including any one element alone or in combination with one or more of the other elements which may also include, in combination, additional elements not listed.

Recitation of ranges of values herein are merely intended to serve as a shorthand method of referring individually to each separate value falling within the range, unless otherwise indicated herein, and each separate value is incorporated into the specification as if it were individually recited herein. For example, if a concentration range is stated as 1% to 50%, it is intended that values such as 2% to 40%, 10% to 30%, or 1% to 3%, etc., are expressly enumerated in this specification. These are only examples of what is specifically intended, and all possible combinations of numerical values between and including the lowest value and the highest value enumerated are to be considered to be expressly stated in this application.

The modifier "about" used in connection with a quantity is inclusive of the stated value and has the meaning dictated by the context (for example, it includes at least the degree of error associated with the measurement of the particular quantity). The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4.

The term "heterogeneous catalyst," as used herein, means a catalyst that is in a separate phase from the reactants. For example, the heterogeneous catalyst used in the methods described herein may be a heterogeneous catalyst in U.S. patent application Ser. No. 14/801,541, the contents of which are incorporated herein in their entirety. The heterogeneous transition metal catalyst described herein may also be in U.S. patent application Ser. No. 14/801,541.

The term "homogeneous catalyst," as used herein, means a catalyst that is in the same phase as the reactants. For example, the homogeneous catalyst used in the methods described herein may be a homogeneous catalyst in U.S. patent application Ser. No. 14/801,554, the contents of which are incorporated herein in their entirety. The homogeneous transition metal catalyst described herein may also be in U.S. patent application Ser. No. 14/801,554.

The term "isotopically enriched," as used herein with reference to any particular isotope of any particular atom of a compound, means that in a composition comprising a plurality of molecules of the compound, the amount (e.g., fraction, ration or percentage) of the plurality of molecules having the particular isotope at the particular atom is substantially greater than the natural abundance of the particular isotope, due to synthetic enrichment of the particular atom with the particular isotope. For example, a composition comprising a compound with an isotopically enriched $^{15}N$ atom at a particular location includes a plurality of molecules of the compound where, as a result of synthetic enrichment, the percentage of the plurality of molecules having $^{15}N$ at that location is greater than about 1% (the natural abundance of $^{15}N$ is substantially less than 1%), and in many cases is substantially greater than about 1%. Similarly, a composition comprising a compound with an isotopically enriched deuterium (D) atom at one or more particular locations includes a plurality of molecules of the compound, where as a result of synthetic enrichment, the percentage of the plurality of molecules having D at each of the one or more particular locations is greater than about 1% (the natural abundance of D is substantially less than 1%), and in many cases is substantially greater than about 1%. In some cases, a composition comprising a compound with an isotopically enriched atom at a particular location may include a plurality of molecules of the compound, where the amount of the plurality of molecules having the isotope at the location may be at least about two-or-more-fold greater than the natural abundance of the isotope, including but not limited to at least about two-fold, at least about three-fold, at least about four-fold, at least about five-fold, at least about 10-fold, at least about 20-fold, at least about 30-fold, at least about 40-fold, at least about 50-fold, at least about 60-fold, at least about 70-fold, at least about 80-fold, at least about 90-fold, at least about 100-fold, and at least about 200-fold, among others. In some cases, a composition comprising a compound with an isotopically enriched atom at a particular location also may include a plurality of molecules of the compound where, as a result of synthetic enrichment, at least about 1%, at least about 5%, at least about 10%, at least about 15%, at least about 20%, at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, or at least about 95%, of the plurality of molecules have the isotope at the location.

The term "natural abundance," as used herein with reference to any particular isotope of an element, refers to the abundance of the isotope as naturally found on the planet Earth. For example, the natural abundance of $^{15}N$ on the planet Earth is generally regarded to be about 0.37% (i.e., substantially less than about 1%), while the natural abundance of deuterium (D) on the planet Earth is generally regarded to be about 0.015% (i.e., substantially less than about 1%).

2. SABRE-SHEATH

In one aspect, described herein is a method of directly transferring para-$H_2$ polarization to heteronuclei, using extremely low magnetic fields (microTesla), without the need of rf irradiation or pulses. The heteronuclei may comprise $^{15}N$, $^{13}C$, $^{29}Si$, $^{31}P$ or $^{19}F$.

To promote efficient hyperpolarization transfer, frequency differences between the para-$H_2$-derived hydride protons and the to-be-polarized target nuclei should preferably match the J-coupling interactions that connect the polarization source and target nuclei.

Figure 2B:
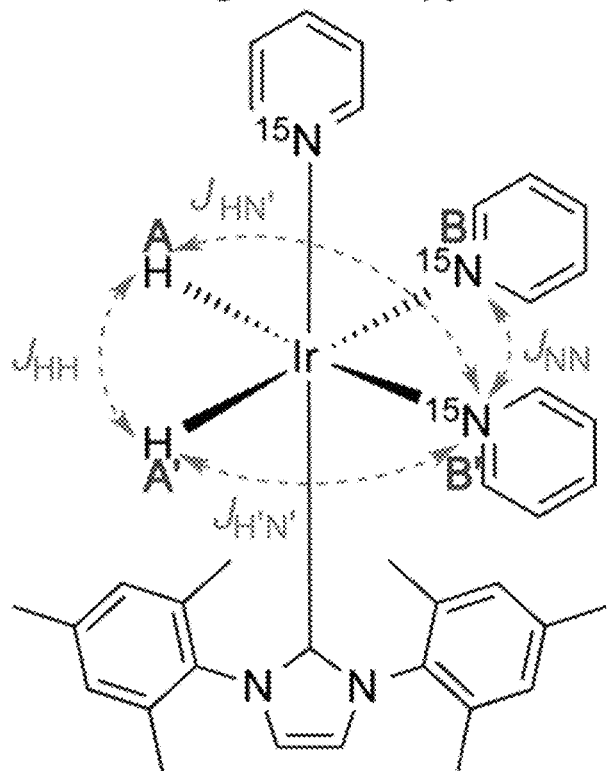
FIG. 2B shows a AA'BB' spin system formed by two Ir-hydride protons and two $^{15}N$ sites of two exchangeable $^{15}N$-pyridines shown in the structural diagram of the activated Ir-IMes catalyst using $^{15}N$-Py substrate.

In certain embodiments, efficient transfer of hyperpolarization from nascent parahydrogen protons of Ir-hydride to heteronuclei (e.g., $^{15}N$-Py) in a SABRE experiment is possible if the frequency difference between the Ir-hydride protons and $^{15}N$ on the complex matches specific J-coupling terms, as displayed in FIG. 2. As derived below, both of the following resonance conditions enable hyperpolarization transfer:

$$\Delta v_{HN} = |J_{HH} + J_{NN} - (J_{HN} + J_{HN'})/2| \quad (1)$$

$$\Delta v_{HN} = |J_{HH} - J_{NN}| \quad (2)$$

where $\Delta v_{HN} = v_H - v_N$ is the frequency difference between Ir-hydride protons and catalyst-bound $^{15}N$, and the J-couplings are as depicted in FIG. 2.

The two hydride protons and two $^{15}N$ nuclei within the two exchangeable substrates form an AA'BB' spin system. Within this AA'BB' system, the polarization transfer takes place. In general, the Hamiltonian of an AA'BB' system is given as $$H = v_A(I_{Az} + I'_{Az}) + v_B(I_{Bz} + I'_{Bz}) + J_{AA} I_A I'_A + J_{BB} I_B I'_B + J_{AB} \cdot (I_A I_B + I'_A I'_B) + J'_{AB}(I'_A I_B + I_A I'_B) \quad (3)$$

Figure 3A:
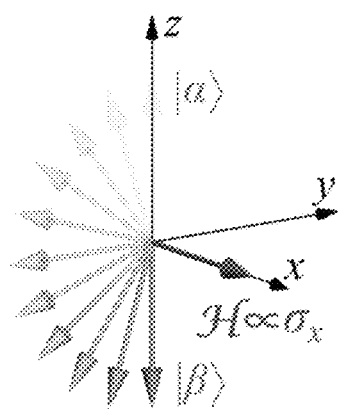
FIG. 3A illustrates an initial state in the z-direction (population on the diagonal element) rotating about a Hamiltonian along x. This Hamiltonian has real positive off-diagonal and zero diagonal elements.

To gain intuition about the polarization transfer dynamics, it is useful to embrace the vector representation of spin rotations. For example, in the traditional (one spin-½) vector representation, the position along +z corresponds to the spin state $|\alpha\rangle$ and the position along −z corresponds to spin state $|\beta\rangle$. Thus, an initial spin state $|\alpha\rangle$ could be rotated by a Hamiltonian pointing along x as depicted in FIG. 3A. This matrix element connects $|\alpha\rangle$ and $|\beta\rangle$, transferring population in $|\alpha\rangle$ to population in $|\beta\rangle$. The corresponding density matrix representation of initial state, pi with population in $|\alpha\rangle$, x-Hamiltonian, '$H_x$, and final state, $\rho_f$ with population in $|\beta\rangle$, are $$\rho_i = \begin{pmatrix} \langle\alpha| & \langle\beta| \\ |\alpha\rangle & 1 & 0 \\ |\beta\rangle & 0 & 0 \end{pmatrix}, \mathcal{H}_x = \begin{pmatrix} \langle\alpha| & \langle\beta| \\ |\alpha\rangle & 0 & 1 \\ |\beta\rangle & 1 & 0 \end{pmatrix}, \text{ and } \rho_f = \begin{pmatrix} \langle\alpha| & \langle\beta| \\ |\alpha\rangle & 0 & 0 \\ |\beta\rangle & 0 & 1 \end{pmatrix} \quad (4)$$

where useful features include that populations are represented by real on-diagonal elements and the x-Hamiltonian is represented by real off-diagonal elements without contributions on the diagonal.

The hyperpolarization transfer process in AA'BB' systems may be understood by choosing the right basis set and using the following equations with the singlet-triplet basis applied to both the A spin pair and the B spin pair:

$$T_+ = |\alpha\alpha\rangle, T_- = |\beta\beta\rangle, T_0 = \frac{1}{\sqrt{2}}(|\alpha\beta\rangle + |\beta\alpha\rangle), \quad (5)$$

$$\text{and } S_0 = \frac{1}{\sqrt{2}}(|\alpha\beta\rangle - |\beta\alpha\rangle)$$

Combining the A states and the B states results in 4×4=16 total states (for example, the "singlet A-singlet B" state $|S^A S^B\rangle$). Para-$H_2$ is the prototypical singlet state and populates all four states that contain $S^A$. SABRE-SHEATH experiments may work with $|S_0 S_0\rangle$ and $|S_0 T_-\rangle$, which are coupled, by the AA'BB' Hamiltonian, to $|T_- T_+\rangle$ and $|T_- S_0\rangle$, respectively:

$$\mathcal{H}_{AA'BB'} = \begin{array}{c} \\ |S_0^A S_0^B\rangle \\ |T_-^A T_+^B\rangle \end{array} \begin{pmatrix} \langle S_0^A S_0^B| & \langle T_-^A T_+^B| \\ -(J_{AA} + J_{BB}) & -\Delta J_{AB}/2 \\ -\Delta J_{AB}/2 & \frac{\sum J_{AB}}{2} - (v_A - v_B) \end{pmatrix} \quad (5a)$$

$$\mathcal{H}_{AA'BB'} = \begin{array}{c} \\ |S_0^A S_0^B\rangle \\ |T_-^A T_+^B\rangle \end{array} \begin{pmatrix} \langle S_0^A S_0^B| & \langle T_-^A T_+^B| \\ -(J_{AA} + J_{BB}) & -\Delta J_{AB}/2 \\ -\Delta J_{AB}/2 & -(v_A - v_B) - \frac{\sum J_{AB}}{2} \end{pmatrix} \quad (5b)$$

where $\Delta J_{AB} = J_{AB} - J_{AB'}$ and $\sum J_{AB} = J_{AB} + J_{AB'}$.

Figure 3B:
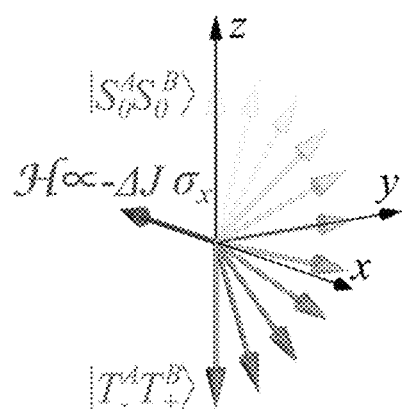
FIGS. 3B and 3C illustrate the SABRE-SHEATH hyperpolarization process.
Figure 3C:
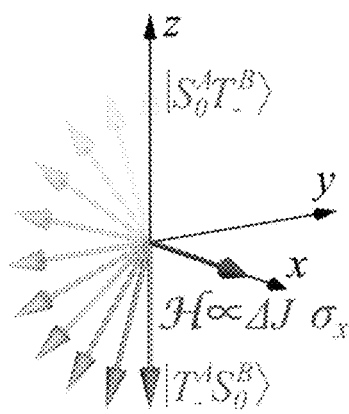

The form of eq 5a implies that population can be transferred from $|S_0 S_0\rangle$ to $|T_+ T_-\rangle$ when the difference between the diagonal elements in that part of the Hamiltonian becomes small. For example, when the diagonal elements are equalized as $-(J_{AA} + J_{BB}) = \sum J_{AB}/2 - (v_A - v_B)$, then the off-diagonal elements can take full effect and rotate population from $|S_0 S_0\rangle$ to $|T_- T_+\rangle$, as depicted in FIG. 3B: The off diagonal elements $-\Delta J_{AB}/2$ are real and negative (isomorphic with $-\sigma_x$); hence, they are depicted as a vector along −x. This process forms hyperpolarization in the $T_+$ state of the targeted (B) spins corresponding to detectable magnetization. Hence, from eq 5a the first resonance condition given in eq 1 can be deduced (by equalizing the diagonal elements). Similarly, eq 5b shows that hyperpolarization can be transferred from the $|S_0 T_-\rangle$ diagonal element to $|T_- S_0\rangle$ when the diagonal elements in the Hamiltonian are equalized $-v_B - J_{AA} = -v_A - J_{BB}$, as illustrated in FIG. 3C, establishing the second resonance condition given in eq 2. Hyperpolarization can be observed because $T^B$ is depleted, in effect creating overpopulation in $T_+$, just as predicted by the first resonance condition as well. Over-population in $T^B_+$ corresponds to alignment with the main magnetic field only for species with positive γ (e.g., $^{13}C$); for species with negative γ (such as $^{15}N$), overpopulation in $T_+$ corresponds to anti-alignment with the main magnetic field—in accordance with the experimental observations detailed below. In the scenario that $J_{HH}$ (~9 Hz) dominates the J-coupling terms, all resonance conditions (those of eqs 1 and 2) are satisfied simultaneously, and a useful hyperpolarization transfer field can be estimated as $B_{0\text{-}transfer} \approx J_{HH}/(\gamma_A - \gamma_B) \approx 0.26$ µT, assuming a J-coupling term ($J_{HH}$) of ~9 Hz (FIG. 2).

The resonance conditions need not be met precisely, because continuous exchange of para-$H_2$ and substrate reduce the residence times typically to about 0.2 s. For short times (relative to any resonance condition mismatch), the mismatch has only a modest effect on the population transfer. This implies that the effect of multiple exchanges will tend to equilibrate the populations of the states $|S_0 S_0\rangle$ and $|T_- T_+\rangle$, and of the states $|S_0 T_-\rangle$ and $|T_- S_0\rangle$. This assertion is also backed by the experimental observation that the specified resonance matching conditions do not have to be met exactly; instead, if the magnetic field has the adequate order of magnitude, then the desired effect is observed. In this sense, the magnetic field simply has to be low enough, however "true" zero field would likely not produce the observed effects because a sufficient difference between $T_+$ and $T_-$ states must prevail in order to create alignment along the residual magnetic field.

In certain embodiments, the magnetic field causes the matching of the resonance frequency of parahydrogen with the resonance frequency of at least one hyperpolarizable heteronucleus in a compound. In certain embodiments, the resonance frequencies of parahydrogen and the hyperpolarizable heteronuclei are different. In certain embodiments, the resonance frequencies of parahydrogen and the hyperpolarizable heteronuclei are within an order of magnitude of each other.

In certain embodiments, the magnetic field is less than the Earth's magnetic field. In certain embodiments, the magnetic field is less than 50 µT, less than 45 µT, less than 40 µT, less than 35 µT, less than 30 µT, less than 25 µT, less than 20 µT, less than 15 µT, less than 10 µT, less than 5 µT, less than 4 µT, less than 3 µT, less than 2 µT, or less than 1 µT. In certain embodiments, the magnetic field is about 0.1 to about 50 µT, about 0.1 to about 45 µT, about 0.1 to about 40 µT, about 0.1 to about 35 µT, about 0.1 to about 30 µT, about 0.1 to about 25 µT, about 0.1 to about 20 µT, about 0.1 to about 15 µT, about 0.1 to about 10 µT, about 0.1 to about 5 µT, about 0.1 to about 4 µT, about 0.1 to about 3 µT, about 0.1 to about 2 µT, about 0.1 to about 1 µT, about 0.1 to about 0.5 µT, about 0.1 to about 0.4 µT, about 0.1 to about 0.3 µT, about 0.2 to about 0.4 µT, or about 0.2 to about 0.3 µT.

3. SABRE-SHEATH Method

The disclosed method may include bubbling para-$H_2$ through a solution containing activated catalyst and $^{15}$N-Py inside a gi-metal magnetic shield where the hyperpolarization is created (FIG. 1). Subsequently, the sample may be transferred into an NMR magnet for detection by a simple 90° pulse resulting in in-phase signal. This in-phase signal may be useful in imaging applications, where the associated broader lines would suffer signal cancellations if the signals were anti-phase.

SABRE-SHEATH polarization can be demonstrated by placing the NMR tube in a 305 mm-long magnetic shield (Lake Shore Cryotronics, P/N 4065) with ~30 s of bubbling of para-$H_2$. After this ~30 s polarization period, para-$H_2$ delivery can be stopped, and the NMR tube quickly transferred (~4 s) to a 9.4 T Bruker Avance III NMR spectrometer to detect the SABRE-SHEATH polarization through conventional 1D-NMR. Both $^{15}$N and $^{1}$H pulse-acquire NMR experiments can be conducted.

FIG. 4 shows results of SABRE-SHEATH experiments. At concentrations of 4 mM $^{15}$N-Py (and 0.24 mM catalyst), a 30,000-fold polarization enhancement over the thermal level is achieved (FIG. 4A). The thermal $^{15}$N polarization at 9.4 T and room temperature is ~$3.3 \times 10^6$, thus this enhancement corresponds to a $^{15}$N polarization of ~10%. This polarization is not adjusted for relaxation that may occur during sample transfer from magnetic shield to detection region, and the polarization created in the shield may be larger.

Spectra obtained with the 63 mM $^{15}$N-pyridine (6.3 mM catalyst, FIG. 4B) illustrates that with increasing concentrations, the absolute signal can be further increased but the corresponding enhancement level (and the respective polarization, P) is diminished to 3,000 fold (P~1%). The reduced enhancements observed with increasing concentrations may be limited by three factors: (i) the finite amount of dissolved para-$H_2$ may limit the available hyperpolarization that can be passed to $^{15}$N-Py molecules; (ii) the Ir-catalyst and Py concentrations modulate Py residency time, which may affect the efficiency of SABRE polarization transfer; (iii) NHC Ir-catalyst may be a source of $T_1$ relaxation, which in turn may limit the maximum polarization level.

The spectral pattern observed for the free Py in the SABRE-SHEATH experiments (FIGS. 4A and 4B) is as clean in-phase triplet because the dominant two-bond J-coupling between $^{15}$N and the ortho-Py-protons $^2J_{NH}$ is ≈11 Hz. In the traditional low-field SABRE experiment (at ~6 mT) for protons the $^{15}$N-triplet is associated with lower enhancements, but also, it is purely anti-phase, which makes this signal much less useful in imaging applications, because of partial signal cancellation that occurs when spectral lines are broadened.

In the SABRE-SHEATH experiments, (FIGS. 4A and 4B), the free Py and the ligand bound species are both detected. The equatorial Py molecules in the catalytic intermediate exchange quickly and produce the observed hyperpolarization on the free Py. The axial pyridine does not exchange or significantly participate in the hyperpolarization dynamics, but it is visible in the SABRE-SHEATH experiments. This axial pyridine is no longer detectable in the experiments optimized for $^1$H SABRE (FIG. 4C), where antiphase lines result. The NMR lines of the catalyst bound species are intrinsically broadened. Thus, the in-phase lines are still easily observable in SABRE-SHEATH experiments (FIGS. 4A and 4B), however the experiments conducted at ~6±4 mT (FIG. 4C) exhibit anti-phase lines and suffer from signal cancellation in addition to already lower enhancements.

The theory described herein predicts the in-phase signals resulting from standard $I_z$-magnetization in the SABRE-SHEATH experiments. It is speculated that the antiphase signals in the 6±4 mT experiments arise because the initial singlet spin-order of para-$H_2$ is transferred, not only into $I_z$-magnetization on protons, but also into zero-quantum terms (e.g., $ZQ_x = I_{1x}I_{2x} + I_{1y}I_{2y}$) on pairs of Py protons, which are finally transferred (by the $^2J_{NH}$-coupling $\propto I_z S_z$) into anti-phase terms between protons and $^{15}$N (e.g. $I_{1z}I_{2z}S_y$) resulting in anti-phase signals. An additional indication for the involvement of anti-phase and zero-quantum terms are the anti-phase NMR signals also observed on the hydrides as illustrated in FIGS. 5B and 5D which use $^{15}$N-Py. In contrast, the hydride signals observed in $^{14}$N-SABRE experiments (FIGS. 5A and 5C) are purely in-phase.

FIG. 5 contrasts $^1$H hyperpolarization levels observed on $^{15}$N-Py versus those on $^{14}$N-Py. $^1$H-SABRE on $^{15}$N-Py is less effective than that on $^{14}$N-Py regardless of whether the experiments are directed to $^1$H hyperpolarization (SABRE at ~6±4 mT, FIGS. 5A and 5B) or hyperpolarization transfer to $^{15}$N (SABRE in the magnetic shield, FIGS. 5C and 5D). These experiments illustrate that polarization transfer strategies (e.g., $^1$H→$^{15}$N via INEPT) may not be as effective as the direct $^{15}$N-hyperpolarization in the SABRE-SHEATH. While $^{15}$N-Py in methanol was used as a SABRE substrate, this method in principle can be applied (i) to other biomolecular contrast agents with $^{15}$N spin label, (ii) with heterogeneous catalyst, and (iii) in aqueous media.

A. Catalyst Activation and Effect of $O_2$

Figures 6A, 6B, 6C, 6D, 6E, 6F:
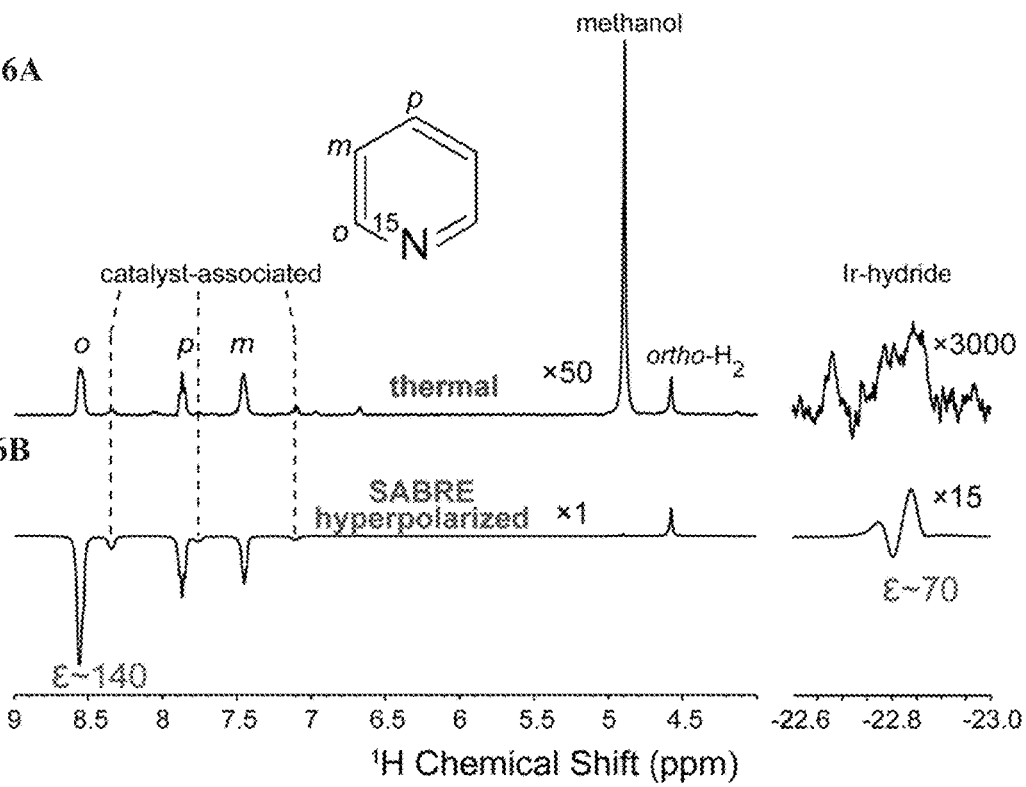
FIG. 6A shows a $^1$H thermal NMR spectrum of 2 mM activated Ir-IMes catalyst solution with 48 mM $^{15}$N-pyridine.
FIG. 6B shows a $^1$H NMR spectrum of hyperpolarized $^{15}$N-Py via conventional low-field (6±4 mT) SABRE. The resonances labeled with dashed lines correspond to catalyst-associated Py.
FIG. 6C-F show $^{15}$N NMR spectra of $^{15}$N-Py hyperpolarized by SABRE-SHEATH.

The [IrCl(COD)(IMes)] catalytic complex with Py substrate requires an initial activation with $H_2$ to eliminate the COD moiety and form the hexacoordinate Ir-hydride complex. This catalyst activation was monitored by in situ SABRE, a process that typically takes 10-20 min. FIG. 6A and FIG. 6B demonstrate the conventional low-field (achieved via para-$H_2$ exchange at 6±4 mT) SABRE proton NMR spectroscopy and corresponding NMR spectrum of the thermal reference. $^1$H hyperpolarization levels are generally suppressed when using $^{15}$N-Py vs natural abundance Py. Nevertheless, signal enhancements of ~140 for ortho-protons of $^{15}$N-Py were observed under these conditions.

Additional experiments exhibited an unexpected dependence on the presence of residual oxygen in the sample. When a SABRE-SHEATH experiment was attempted on a freshly (and fully) activated catalyst/$^{15}$N-Py mixture (FIG. 6C), $^{15}$N P enhancements ($\varepsilon \approx 300$) were observed. Equilibrium $^{15}$N P is ~10 times lower than that of $^1$H due to the large difference in their gyromagnetic ratios.

Therefore, $^{15}$N P values achieved initially in SABRE-SHEATH experiments were lower than the corresponding $^1$H P in conventional low-field SABRE experiments (e.g., FIG. 6B), highlighting the practical challenges of observing efficient SABRE-SHEATH hyperpolarization. Subsequent experiments showed that this reduced efficiency was related to the sample's exposure to air, affording an opportunity to greatly improve the resulting $^{15}$N polarization. Indeed, additional para-$H_2$ bubbling during the next 20 min (with a ~20% duty cycle, i.e., with bubbling "on" for ~30 s and "off" for ~2 min at ~6 atm of para-$H_2$ at a flow rate of ~1 mL·atm·s$^{-1}$) resulted in significantly improved efficiency of the SABRE-SHEATH experiment. For example, FIG. 6D shows a $^{15}$N NMR spectrum taken from a SABRE-SHEATH HP sample, with $^{15}$N P $\varepsilon \approx 3600$. Yet subsequent (re)exposure of this sample to air (via air bubbling for ~5 s) resulted in significant reduction of SABRE-SHEATH efficiency to $\varepsilon \approx 185$ (FIG. 6E). However, renewed para-$H_2$ bubbling (repeating the cycle described above a few times) resulted in a full recovery of the SABRE-SHEATH hyperpolarization efficiency, as depicted in FIG. 6F. Bubbling with para-$H_2$ for an extended period of time does not appear to change the expected $^{15}$N hyperpolarization level for any reason other than removing oxygen. Once the oxygen has been removed, the subsequent $^{15}$N SABRE-SHEATH experiments may generate a reproducible level of $^{15}$N hyperpolarization, regardless of the magnitude of the delay (during which para-$H_2$ bubbling was stopped) between the individual experiments (even when the delay was changed from 1 min to 1 h). Taken together, these results likely indicate that residual $O_2$ in the catalyst/$^{15}$N-Py methanol-$d_4$ solution may be detrimental to the efficiency of SABRE-SHEATH (performed in microtesla fields) compared to that of conventional low-field ($^1$H, millitesla) SABRE. $O_2$ is a well-known paramagnetic relaxation source that has been shown to significantly reduce $T_1$ of HP $^{129}$Xe, particularly in low magnetic fields.

B. Effect of Para-$H_2$ Pressure and Flow Rate

The maximum achieved $^{15}$N P of $^{15}$N-Py described herein was ~10%, corresponding to F z 30,000 at the time of signal detection in the 400 MHz NMR spectrometer (FIG. 7A-C). The actual initial $^{15}$N polarization created within the shield prior to sample transfer is likely even higher, because of $T_1$ relaxation losses suffered in transit (requiring ~5 s). The respective effects of para-$H_2$ pressure and flow rate could not be reliably discriminated using the flow meter because its throughput (in mL·atm·s$^{-1}$) is proportional to the product of volume and pressure per unit time. As a result, the same setting of the flow meter at two different pressures would result in two different mass flow rates measured in standard cubic centimeters per minutes (sccm). Therefore, a digital mass-flow controller regulating flow irrespective of bubbling pressure was utilized instead for these measurements, where the flow rate was varied at different pressures resulting in isobar curves (FIG. 7D).

The effect of the pressure is negligible at flow rates of ≤10 sccm in the range of the para-$H_2$ pressures studied, suggesting that in this regime the quantity of delivered para-$H_2$ per unit of time may be the limiting factor, not the para-$H_2$ pressure. $^{15}$N SABRE-SHEATH (and thus $^{15}$N $P_{max}$) generally rose with increasing flow rate. The growth of the $^{15}$N signal with increasing flow rate (and the quantity per unit time of delivered para-$H_2$ acting as source of nuclear spin hyperpolarization) was most significant in the regime of low flow rates (~20 sccm and below, FIG. 7D). Further increase in the flow rate (above ~20 sccm) may have a diminishing return, likely because hydrogen mass transport across the gas-liquid interface may become a limiting factor. As such, the introduced para-$H_2$ gas is exchanging with the liquid less efficiently. This is illustrated in the 2.7 atm isobar, where the increase in the flow rate eventually leads to the abnormal decrease of the $^{15}$N NMR signal. This behavior may be caused by the gas bubble dynamics in the NMR tube, because the volume of the gas at low pressure (at the same flow rate in sccm) is greater, which resulted in larger bubbles and inefficient mixing of para-$H_2$ gas and its transfer into the liquid phase. Indeed, the isobars at 1.0 and 2.7 atm produced lower signal at higher flow rates when compared to those at 5.1 and 7.1 atm. Thus, higher pressure is still more desirable to maximize $^{15}$N signal (and $^{15}$N P), but from the perspective of more efficient gas mixing and para-$H_2$ delivery (moles per unit of time) to the catalyst (in this setup using para-$H_2$ bubbling in the NMR tube). Therefore, such bubbling SABRE-SHEATH hyperpolarization setups may benefit from operation at significantly higher para-$H_2$ pressures to maximize the amount of para-$H_2$ available for SABRE processes. Furthermore, access of the Ir-hydride complex to para-$H_2$ (delivery of sufficient quantity of para-$H_2$ to Ir-hydride centers to maintain their HP state for further polarization transfer to heteronuclear sites of substrates) is a useful determining factor for increasing the efficiency of SABRE-SHEATH and maximizing the payload of HP agent.

C. Effect of Temperature

The reaction temperature may modulate the residence time of both the Py substrate and para-$H_2$, thereby altering exchange rates. Correspondingly, previous studies of conventional low-field SABRE have observed temperature dependences of SABRE hyperpolarization levels. FIG. 7E demonstrates an explicit temperature dependence of $^{15}$N SABRE-SHEATH polarization, with greater signal enhancements measured at lower temperatures. While others have identified that for $^1$H SABRE the performance for this catalyst peaks at >40° C. in methanol-$d_4$, the discrepancy may be explained by several factors, including that (i) higher para-$H_2$ pressures (and consequently solution concentrations) were used and (ii) the interactions (the relevant spin-spin couplings) leading to NMR hyperpolarization in homonuclear (for proton SABRE hyperpolarization) and heteronuclear (for SABRE-SHEATH $^{15}$N hyperpolarization) are different, possibly giving rise to differing useful residency times for SABRE hyperpolarization.

D. Effect of Magnetic Field on $^{15}$N $T_1$ $T_1$ measurements were performed by inducing $^{15}$N SABRE-SHEATH hyperpolarization in the magnetic shield, which was followed by a variable delay for polarization decay in the magnetic shield (microtesla), in the fringe field of the main magnet (~6 mT), or in the 9.4 T field of the magnet. Representative corresponding data sets showing the dependence of the NMR signal on the delay time at these fields are provided in FIG. 7F, exhibiting the overall trend: $^{15}$N $T_1^{9.4T} > ^{15}$N $T_1^{6\ mT} > ^{15}$N $T_1^{\mu T}$.

E. Effect of $^{15}$N $T_1$ in Microtesla Fields on % P

Figure 8A:
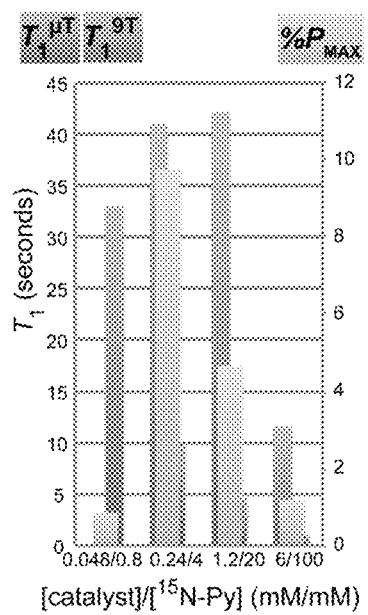
FIGS. 8A, 8B, 8C, 8D, 8E and 8F depict a summary of $^{15}$N relaxation times T$_1$ at the microtesla (μT) field inside the magnetic shield (T$_1^{\mu T}$) and at 9.4 T (T$_1^{9T}$) and percentage $^{15}$N polarization (% P) for $^{15}$N SABRE-SHEATH of $^{15}$N-Py for various Ir-IMes catalyst and $^{15}$N-Py concentrations.
Figure 8B:
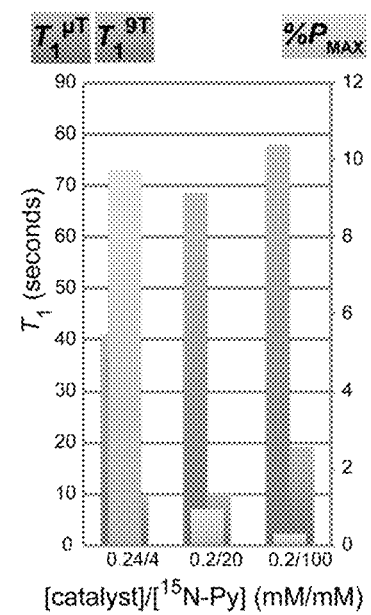
Figure 8C:
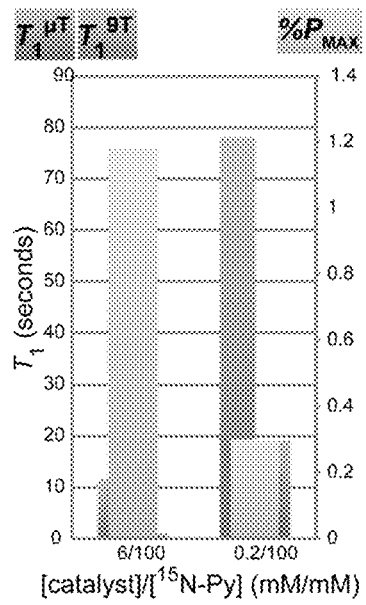
Figure 8D:
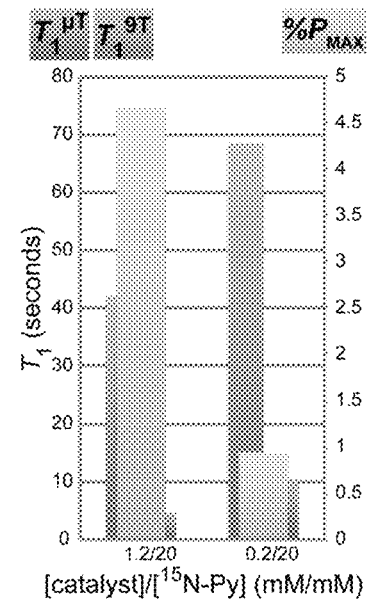
Figure 8E:
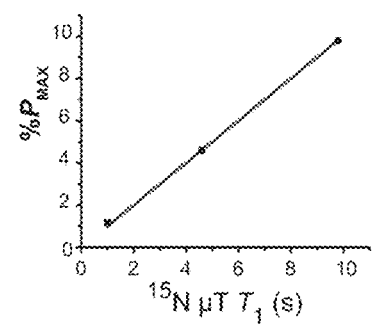
Figure 8F:
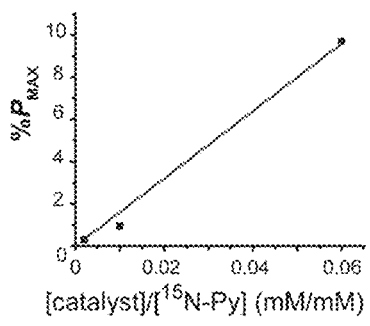

As indicated above, the $^{15}$N $T_1$ values were lowest in the μT field. $T_1$ may modulate the build-up rate and the maximum attainable polarization, as can be seen in a dilution series (6 mM/100 mM, 1.2 mM/20 mM, and 0.24 mM/4 mM for the fixed [catalyst]/[$^{15}$N-Py] ratio) shown in FIG. 8A, where μT $T_1$ gains are correlated with gains in $P_{max}$ (defined as $^{15}$N P after SABRE-SHEATH polarization accumulation for a period of time greater than $3T_1$, FIG. 8E). While further dilution led to additional $T_1$ gain (0.048 mM/0.8 mM), there may be other parameters (such as the residence times) that are affected by this extreme dilution, which results in significantly lower $P_{max}$ (FIG. 8A). FIG. 8B provides additional evidence showing the trends for $P_{max}$ and $T_1$ for solutions with fixed [catalyst] and variable ([$^{15}$N-Py]([catalyst]/[$^{15}$N-Py] ratio was varied). While the μT $T_1$ remained at approximately the same level of ~10 s, the increase in [$^{15}$N-Py] resulted in the corresponding decrease of $P_{max}$ (FIG. 8F). FIGS. 8C and 8D show the trends of $P_{max}$ and $T_1$ as a function of [catalyst] at fixed concentrations of [$^{15}$N-Py] of 100 mM and 20 mM. Accordingly, multiple effects (e.g., $T_1 \propto$ [catalyst]$^{-1}$, $P_{max} \propto$ [catalyst]/[$^{15}$N-Py]) may cause changes in $P_{max}$ in a complex fashion. These results highlight the underlying factors that must be considered when attempting to maximize the hyperpolarization level $P_{max}$, which is a useful deliverable for biomedical application using HP contrast agents.

F. $^{13}$C SABRE-SHEATH

Hyperpolarization of aromatic $^{13}$C sites of $^{15}$N-Py via SABRE in general may be useful due to (i) greater $^{13}$C natural abundance vs $^{15}$N, (ii) more readily available detection hardware, and (iii) better detection sensitivity. However, since SABRE-SHEATH relies on the J-coupling between exchangeable protons of Ir-hydride and the target nucleus, its efficiency may be reduced because the requisite long-range (three-, four-, and five-bond) J-couplings are weak. FIG. 9 shows the comparison between conventional (low-field) and SABRE-SHEATH hyperpolarization processes for $^{13}$C, demonstrating that the expected antiphase signatures seen in low-field SABRE can indeed be collapsed into inphase NMR peaks (split by $J^1_{CH}$ spin-spin couplings) by SABRE-SHEATH. However, the achieved $^{13}$C signal enhancements were marginal, (ε=7 or below). Furthermore, the enhancement values for three magnetically inequivalent carbon sites of the Py molecule were in accord with the range of J coupling interactions between aromatic carbons and Ir-hydride protons ($\varepsilon(J^3) > \varepsilon(J^4) > \varepsilon(J^5)$) for ortho-, meta-, and para-positions. An adequate field-cycling scheme for increasing $^{13}$C hyperpolarization levels may be determined that is suitable for utilizing $^{13}$C SABRE-SHEATH. In addition, double-resonance experiments (for polarization transfer from $^1$H or $^{15}$N to $^{13}$C) may also more efficiently hyperpolarize $^{13}$C spins via SABRE.

4. Applications of SABRE-SHEATH Methods

A. 15N MRI

Figure 10A:
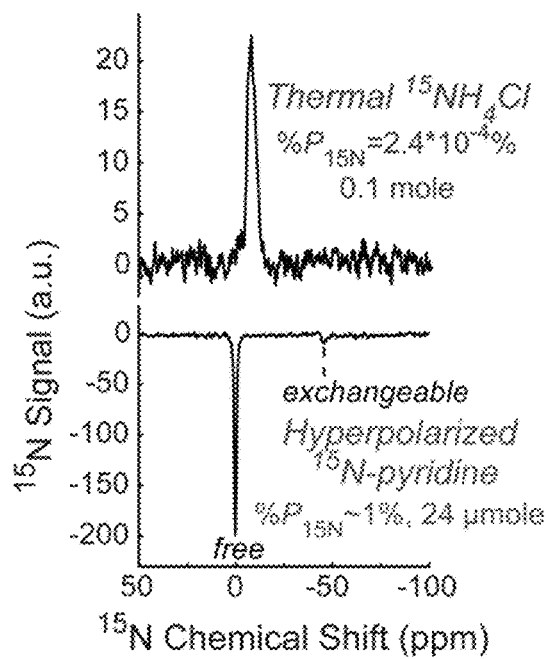
FIG. 10A depicts an $^{15}$N single-scan NMR spectrum of a thermal reference sample of $^{15}$NH$_4$Cl in an aqueous medium and HP $^{15}$N-Py at 20.3 MHz using the following acquisition parameters: RF pulse width (pw)=128 μs (90°), spectra width (sw)=19 840 Hz, acquisition time (acq)=0.5 s.
Figure 10B:
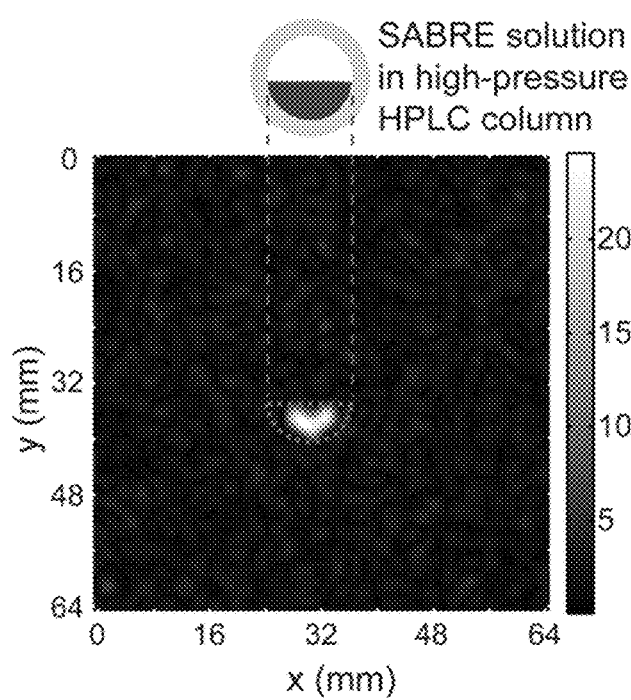
FIG. 10B shows a $^{15}$N 2D projection gradient echo (GRE) MRI using the following acquisition parameters: slice thickness=60 mm, pulse width=500 μs (~15°), field of view=64× 64 mm2, imaging matrix size=32×32 pixels, pixel size (spatial resolution)=2×2 mm$^2$, repetition time (TR)=13 ms, echo time (TE)=6.4 ms, acq=10.6 ms, sw=3005 Hz, and total scan time ~0.4 s. The image was post-processed with zero filling to 256×256 points for enhanced presentation.

The demonstrated % P of $^{15}$N by the SABRE-SHEATH method is equal to or greater than $^{15}$N hyperpolarization achieved by d-DNP and PHIP methods, yet requires only seconds (vs tens of minutes to hours) of hyperpolarization time. The easy access to $^{15}$N hyperpolarization by SABRE-SHEATH prompted a feasibility study of HP $^{15}$N MRI. A slice-selective 2D $^{15}$N MR imaging experiment was performed using a preclinical 4.7 T MRI scanner (FIG. 10B). A modified setup was used to hyperpolarize ~1.2 mL of solution containing 20 mM $^{15}$N-Py, corresponding to ~24 μmol of $^{15}$N Py hyperpolarized to P of ~1% at the time of the detection after a ~30 s long transfer from the magnetic shield to the bore of the 38 mm i.d. $^{15}$N volume coil of a triple-resonance ($^1$H/$^{15}$N/$^{31}$P) RF probe (FIG. 10A). The modified setup utilized a high-pressure HPLC column (Western Analytical Products, Lake Elsinore, Calif., USA, item no. 006SCC-06-15-FF; rated to ~30 atm), with the bottom of the column directly connected to the para-$H_2$ supply from the flow meter via ⅛ in. o.d. PTFE tubing. The top (exit) port was connected to the gas exhaust without any modification of the HPLC column. Para-$H_2$ was bubbled through the standard unmodified filter of this HPLC column from the bottom port, and used $H_2$ gas exited through the top of the HPLC column. It was possible to detect both free and exchangeable $^{15}$N Py resonances after >20 min long catalyst activation using ~9.5 atm of para-$H_2$ pressure. Moreover, an axial 2D $^{15}$N MR image with 2×2 mm$^2$ spatial resolution was successfully acquired showing HP liquid placed inside a 6.6 mm i.d. high-pressure HPLC column. Furthermore, this image was acquired in ~0.4 s, demonstrating the feasibility of subsecond $^{15}$N MRI of HP contrast agents. The detection sensitivity of $^{15}$N HP compounds can be further enhanced by implementation of MRI pulse sequences yielding more SNR (e.g., balanced steady-state free precession (bSSFP)). The long-lived $^{15}$N hyperpolarization can potentially also be transferred to protons for more efficient indirect detection. This practice could boost sensitivity by approximately 10-fold because the detection sensitivity is directly proportional to the gyromagnetic ratio γ and γ($^1$H)≈10γ ($^{15}$N). While indirect proton imaging may be challenging due to the background signal arising from water protons in vivo, low-field HP MR, which can be more sensitive than high-field MRI of HP agents, does not suffer from this shortcoming because at very low fields (e.g., 47 mT) the proton background signal is significantly attenuated. Additionally, polarization transfer schemes that enable indirect proton detection of $^{15}$N HP contrast agents can enable partial polarization transfer from $^{15}$N (storage nucleus with high $T_1$) to $^1$H (detection nucleus with best read-out sensitivity) to enable acquisition of multiple ultrafast (<1 s) images to trace not only the distribution of the contrast agents, but also the kinetics of uptake, metabolism, and other in vivo processes.

While $^{15}$N detection hardware and MRI pulse sequences are not commonplace in clinical settings, the indirect proton detection described above can be used instead for the detection of $^{15}$N HP contrast agents produced by SABRE-SHEATH. Furthermore, more advanced indirect-detection methods do not require any heteronuclear hardware, which may allow RF excitation and detection to be performed only on the proton channels commonly available on all MRI scanners. The latter characteristic thus obviates the requirement for dedicated $^{15}$N channels on MRI scanners and can potentially enable widespread use of $^{15}$N HP contrast agents on conventional MRI scanners, requiring only a software upgrade.

B. Probes for pH Sensing and Mapping

Py and other aromatic N-heterocycles, which are already amenable to SABRE hyperpolarization, represent the fundamental molecular frameworks for many classes of biologically relevant compounds: DNA and RNA bases, vitamins, and numerous drugs and drug building blocks. Therefore, a number of potential HP contrast agents can be employed where N sites amenable to $^{15}$N SABRE-SHEATH can serve as hyperpolarization storage sites for imaging in vivo processes. For example, nicotinamide is linked to many diseases including Alzheimer's disease, cancer, and anxiety, and therefore may be a useful HP probe for these diseases. Py-based HP $^{15}$N agents have been shown useful for pH sensing using the d-DNP hyperpolarization method. This capability is enabled by the large $^{15}$N chemical shift change (>70 ppm) induced by protonation, which causes the $^{15}$N chemical shift to have a straightforward dependence on pH. Non-HP agents using the same principle have already been successfully demonstrated in vivo, with the most prominent application in cancer imaging, because many types of tumors are known to be slightly acidic. Therefore, non-invasive pH sensing and mapping are potential biomedical applications for $^{15}$N SABRE-SHEATH in the context of molecular in vivo imaging. To date, $^{15}$N-SABRE-SHEATH produces $^{15}$N-Py and $^{15}$N-nicotinamide with ~6 times greater hyperpolarization levels compared to those achieved by d-DNP with a much more rapid hyperpolarization process (~1 min vs ~2 h), highlighting the advantages of $^{15}$N SABRE-SHEATH for this class of compounds.

In addition, nitrogen-containing compounds such as pyridine, nicotinamide and others can be enriched with $^{15}$N using simple chemistry that either allows direct heteroatom replacement with $^{15}$N isotope or through a ring opening and closure, frequently using $^{15}$NH$_4$Cl as a very cheap source of spin label. As a result, the labor-intensive de novo synthesis of complex $^{15}$N biomolecules can be largely obviated. Therefore, the $^{15}$N isotopic enrichment required for $^{15}$N SABRE-SHEATH may produce inexpensive contrast agents. Combined with the very simple setup and instrumentation required for SABRE-SHEATH, it may enable fast, high-throughput, scalable, and low-cost production of HP $^{15}$N contrast agents.

In vivo use of HP contrast agents, including $^{15}$N agents, typically requires their administration in aqueous media free from catalysts and activation byproducts. Relevant to this work, the recent reports of heterogeneous SABRE catalysts, continuous SABRE hyperpolarization and aqueous SABRE catalysis are highly synergistic with SABRE-SHEATH for production of HP contrast agents on demand with suitable in vivo administration. Moreover, heterogeneous SABRE catalysts provide an additional benefit of potential catalyst recycling to further minimize the costs associated with catalyst preparation and waste disposal.

C. Hyperpolarization of Neat Liquids

SABRE-SHEATH techniques can also achieve hyperpolarization of neat liquids—each comprised only of an otherwise pure target compound and millimolar concentrations of dissolved catalyst, without any additional diluting solvent. In principle, such liquids could be used directly as hyperpolarized MRI contrast agents; the use of organic solvents is obviated, and a greater payload for the concentrated agents is observed.

Figures 11A, 11B:
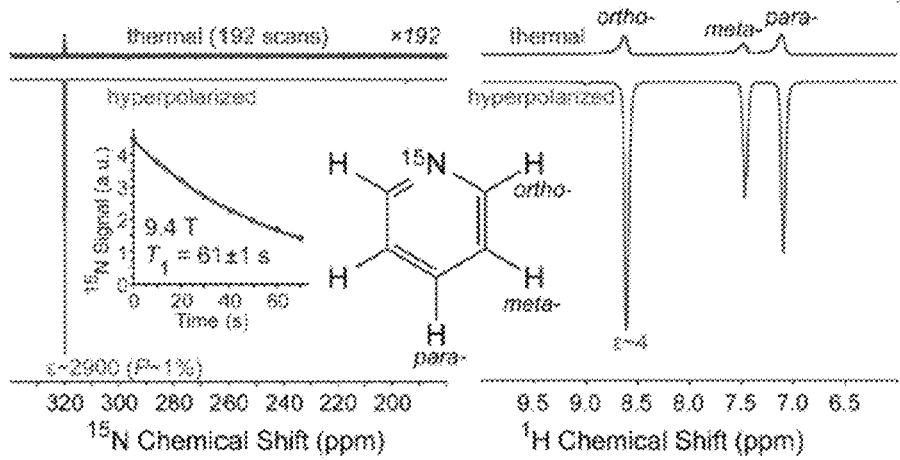
FIGS. 11A, 11B, 11C, 11D, 11E and 11F illustrate the SABRE of "neat" natural abundance $^{15}$N (0.36%) pyridine (Py).
Figures 11C, 11D:
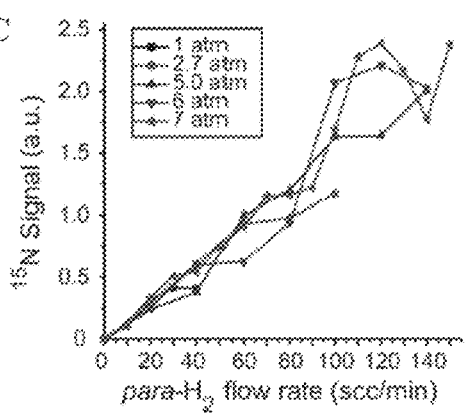

$^1$H SABRE (conducted conventionally at ~6 mT field) yielded very small signal enhancement of $\varepsilon \approx 4$ (FIG. 11B). The $^{15}$N signal exhibited a strong, nearly linear dependence on the flow rate of para-H$_2$ in the range studied (the flow-rate of 150 standard cubic centimeters (sccm) represents an experimental limitation of the setup at ~7 atm), which was metered independently of the applied pressure and hence solution para-H$_2$ concentration (FIG. 11C). The $^{15}$N signal enhancement was approximately independent of the para-H$_2$ pressure (and solution concentration according to Henry's law), indicating that the flux of the available para-H$_2$ spin bath (the source of spin order) was indeed the limiting factor; that is, the potential possibility of exchanging more para-H$_2$ per unit time would likely yield greater $^{15}$N signal enhancements. Larger para-H$_2$ exposure can be attained by higher pressures and smaller bubbles/better gas-phase-liquid-phase mixing.

Figures 11E, 11F:
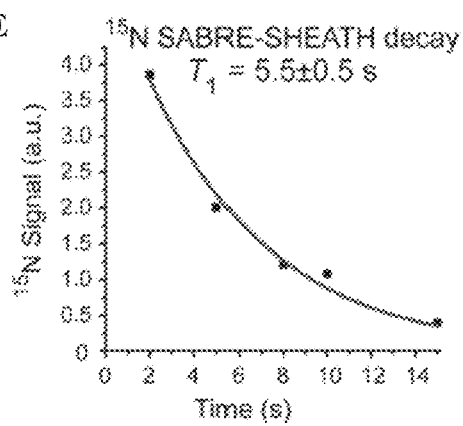

One effect limiting the maximum achievable hyperpolarization is spin-lattice relaxation. The $^{15}$N spin-lattice relaxation time is significantly shorter in microTesla fields than at high field (9.4 T), 5.5±0.5 versus 60.8±0.6 s, respectively (FIG. 11E and FIG. 11F), and such efficient relaxation results in SABRE-SHEATH $^{15}$N enhancements reaching significantly lower steady-state levels after the hyperpolarization procedure. The supply of para-H$_2$ is limited because only ~0.1 mmol/s pass through the tube at the maximum flow rate of 150 sccm, whereas 90 mM catalyst (in ~0.4 mL volume) alone is capable of exchanging of ~0.2 to 0.4 mmol/s of H$_2$ because the hydrogen exchange rate is ~5-10 per second. However, Ir-hydride protons do not have 100% exchange efficiency with para-H$_2$ gas. Instead, this exchange is further constricted by at least two bottlenecks: (i) exchange of H$_2$ between gas and liquid phases and (ii) exchange of dissolved para-H$_2$ with Ir-hydride. Equilibrium H$_2$ concentration in organic solvents is <4 mM/atm; that is, even at the maximum para-H$_2$ pressure used (~7 atm), para-H$_2$ concentration is <30 mM, at least three times lower than that of the Ir-hydride catalyst at 90 mM concentration. Moreover, when para-H$_2$ singlet spin order is transferred to Py via SABRE, para-H$_2$ becomes ortho-H$_2$, manifesting as an HP byproduct, and this resulting ortho-H$_2$ can no longer serve as a source of hyperpolarization in conventional ex situ SABRE. Furthermore, hydride proton exchange rates are on the order of 10 per second; therefore, each para-H$_2$ molecule on average experiences >30 exchanges per second under these conditions ([catalyst] of ~90 mM results in the total of ~900 para-H$_2$ exchanges per second for <30 mM [para-H$_2$] dissolved). The main implication of the above two bottlenecks, the fast hydrogen exchange and the limited flux of para-H$_2$ gas, is that [ortho-H$_2$]>>[para-H$_2$]. Furthermore, the additional feature of the complex interplay of micro Tesla $^{15}$N effective T$_1$ and limited access to para-H$_2$ is that it should imply the existence of a useful catalyst concentration and a useful ratio of Py to catalyst concentrations.

The additional evidence that the finite para-H$_2$ spin bath is limiting the SABRE processes is also seen when n.a. Py ($\varepsilon \sim 2900$) was replaced by 99% $^{15}$N enriched Py (15N-Py, $\varepsilon \approx 33$), Table 1. $^{15}$N signal enhancement decreases by nearly 2 orders of magnitude (88-fold), while the concentration of $^{15}$N spins is increased by 278 fold (=1/0.0036); however, the total Py concentration and quantity is maintained the same. As such, the observed signal (given by the product of [$^{15}$N] and E) only decreases by 3 fold when working with n.a. Py. Another aspect is that $^{15}$N microTesla effective $T_1$ of $^{15}$N-Py (10.2±1.1 s) is longer than that of n.a. Py (5.5±0.5 s); see Table 1.

TABLE 1

Summary of Results with Natural Abundance (n.a.) Pyridine (Py), Py-d$_5$, $^{15}$N—Py, and their mixtures

| | [$^{15}$N] (mM) | $^{15}$N ε @ 9.4 T | $^{15}$N effective $T_1$ μT (s) | $^{15}$N $T_1$ 9.4 T (s) | ortho-[$^1$H] (mM) | $^1$H ε @ 9.4 T | [catalyst] (mM) |
|---|---|---|---|---|---|---|---|
| 1) Py (n.a.)$^b$ | ~45 | ~−2900 | 5.5(0.5) | 60.8(0.6) | ~25000 | ~−4.2 | ~90 |
| 2) Py-d$_5$ (99.5% d) | ~45 | ~−850 | 2.2(0.1) | 74.3(2.9) | ~125 | ~−60 | ~90 |
| 3) $^{15}$N—Py | ~12500 | ~−33 | 10.2(1.1 | 66.8(0.5) | ~25000 | ~−0.3 | ~90 |
| 4) catalyst activated with $^{15}$N—Py, then Py-d$_5$ added | ~2000 | ~−520 | 10.1(0.8) | 69.9(0.3) | ~4000 | ~−2.6 | ~90 |
| 5) catalyst activated with Py-d$_5$, then $^{15}$N—Py is added | ~1800 | ~−400 | 15.1(2.3) | 73.2(0.3) | ~3600 | ~−2.7 | ~90 |
| 6) catalyst activated with $^{15}$N—Py, then in n.a. Py is added | ~1800 | ~−450 | 9.9(1.1) | 70.0(0.3) | ~3600 | ~−1.0 | ~90 |
| 7) catalyst activated with n.a. Py, then $^{15}$N—Py is added | ~1800 | ~−380 | 8.2(1.1) | 69.9(0.3) | ~3600 | ~−0.6 | ~90 |

$^b$Conducted with >90% para-H$_2$, while the rest of the data is collected using 65-75% para-H$_2$, resulting in ~30-40% lower signal enhancements compared with those shown in row 1. Note that the data for pairs 2 and 3, 4 and 5, and 6 and 7 were respectively collected on the same day at the same level of para-H$_2$ enrichment and stored in a pressurized aluminum cylinder as previously described (and thus should be directly comparable).

Figure 12A:
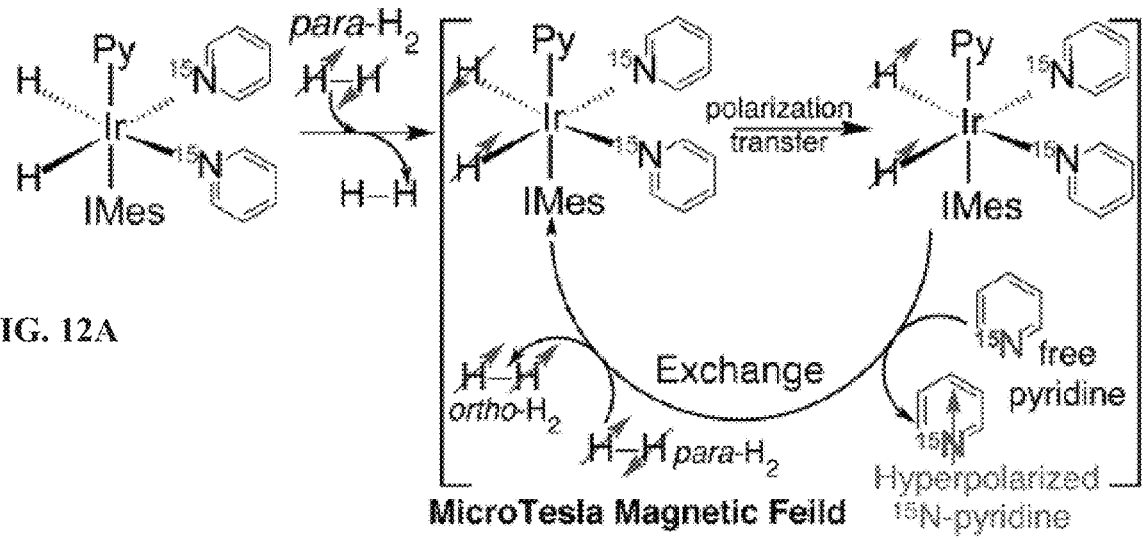
FIGS. 12A and 12B illustrate diagrams of para-$H_2$ exchange and $^{15}N$ SABRE-SHEATH hyperpolarization in the absence (FIG. 12A) and in the presence (FIG. 12B) of $^{14}N$-Py excess. The exchange with $^{14}N$-Py does not cause a significant reduction in the spin order of the para-$H_2$ pool. Both equatorial pyridines of the active complex undergo the chemical exchange with free Py in solution, while the axial pyridine (labeled as "Py") is not exchangeable.
Figure 12B:
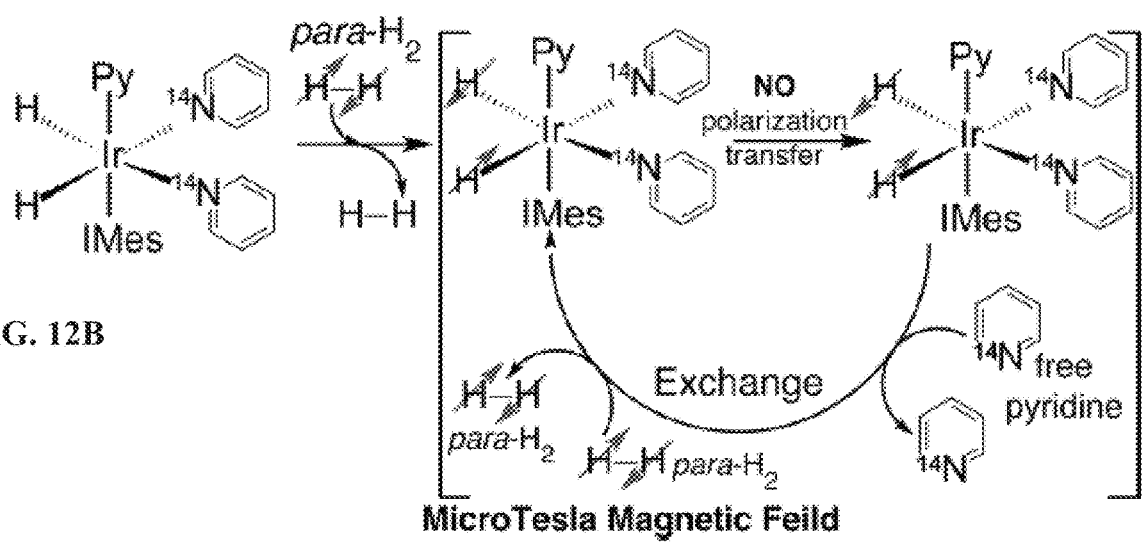

Furthermore, achieving such significantly greater (by 88-fold)$^{15}$N ε in n.a. Py with respect to $^{15}$N-Py under the conditions of limited access to para-H$_2$ has a significance for the mechanistic understanding of the SABRE-SHEATH phenomenon. In particular, this result indicates that the hyperpolarization para-H$_2$ spin bath is not depleted when the exchanging substrate on Ir-hydride catalyst is $^{14}$N-Py. If no interaction between para-state of hydride and $^{15}$N-Py occurs (e.g., the exchanging partner is $^{14}$N-Py), para-state of hydride should exchange back into para-H$_2$ with preservation of the para-H$_2$ hyperpolarization pool (FIG. 12B). As such, the spin order residing in the entire pool of para-H$_2$ can be selectively channeled to hyperpolarize $^{15}$N nuclei of the exchangeable substrate (e.g., n.a. Py) rather than being depleted by rapidly relaxing $^{14}$N sites acting as hyperpolarization sinks. This allows achieving relatively high levels of $^{15}$N hyperpolarization (e.g., P$^{15}$N≈1%), even when performing SABRE-SHEATH in the high substrate concentration regime encountered with effectively neat solutions and when the supply and transport of para-H$_2$ are restricted. The $^{14}$N species likely do not deplete the para-H$_2$ state because the quadrupolar relaxation rate of the $^{14}$N spins is faster than the J-coupling interactions that would otherwise transfer hyperpolarization to the target spins; hence, the $^{14}$N spins are effectively (self)decoupled from the bound para-H$_2$.

Figure 13A:
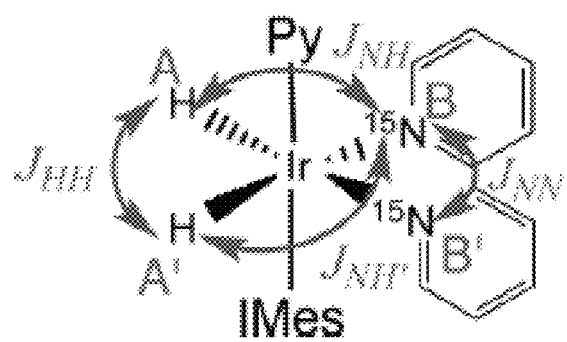
FIGS. 13A and 13B illustrate spin systems used for analytical derivation of the resonance conditions for (FIG. 13A) $^{15}N$-Py solutions and (FIG. 13B) n.a. Py solutions. In panel A, in addition to the displayed couplings, $J_{HN}=J_{H'N'}$ and $J_{HN'}=J_{H'N}$. Couplings to spins in axial positions are ignored because they generally are smaller than equatorial couplings and play a subordinate role. (Additionally, this site does not exchange with free substrate.)
Figure 13B:
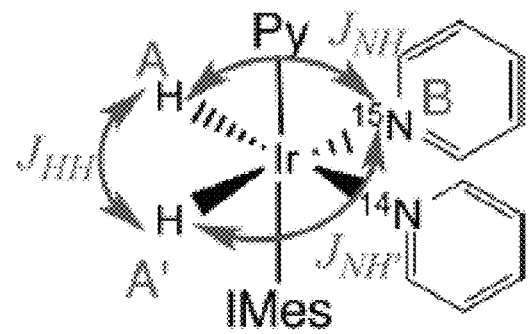

The theoretical model of SABRE-SHEATH described above, while appropriate for $^{15}$N-enriched substrates, no longer applies for n.a. Py, and an amended theoretical model is presented to describe the polarization transfer in the n.a. case. The original model invoked an AA'BB' four spin system, where AA' represents the parahydrogen-derived hydrides and BB' represents the equatorial (exchangeable) $^{15}$N spins depicted in FIG. 13A. For this case, the magnetic field must be chosen such that at least one of the following resonance conditions are met:

$$\Delta v_{HN} = |J_{HH} + J_{NN} - (J_{HN} + J_{HN'})/2| \quad (6)$$

$$\Delta v_{HN} = |J_{HH} - J_{NN}| \quad (7)$$

When these resonance conditions are met, then the N—H J couplings drive the hyperpolarization transfer; specifically, the term $(J_{HN} - J_{HN'})/2$ determines the rate of hyperpolarization transfer. However, in the n.a. Py case, this spin system has to be adjusted because in 99.64% (=100−0.36%) of species that contain one $^{15}$N spin the adjacent equatorial species is a $^{14}$N spin, not $^{15}$N; therefore, the model is amended to an AA'B three-spin system, where AA' represents the parahydrogen derived hydrides and B represents the $^{15}$N spin. The $^{14}$N spin can be ignored because the strong quadrupolar interaction decouples the $^{14}$N spin from the depicted spin systems. As a result, the resonance condition for the new model is $$\Delta v = |J_{HH} - (J_{HN} + J_{HN'})/4| \quad (8)$$

In the three-spin system it is also the NH-J couplings that drive the hyperpolarization transfer; here it is specifically the term $(J_{HN} - J_{HN'})/(2\sqrt{2})$, which determines the rate of hyperpolarization transfer.

Next, conventional homonuclear $^1$H-SABRE experiments were performed. The $^1$H signal enhancements, which were determined in the milliTesla regime (Table 1) followed the general trend seen for $^{15}$N SABRE-SHEATH, with signal enhancements being greater when the proton spin bath of to be-hyperpolarized substrate was reduced. For example, ε≈(−)60 was observed for Py-d$_5$ versus ε≈(−)4.2 for n.a. Py, which is in agreement with the previous results above.

Because $^{14}$N and other quadrupolar nuclei may act as direct or indirect hyperpolarization sinks (e.g., polarization transfer from Ir-hydride protons to $^{14}$N, D, etc. or from $^{15}$N (after hyperpolarization transfer from para-H$_2$) to $^{14}$N, D, etc.) at low magnetic fields (analogous to interaction between $^{129}$Xe and $^{131}$Xe in xenon lattices), and because the local molecular environment can significantly alter the $^{15}$N effective $T_1$ in the microTesla field regime, $^{15}$N SABRE-SHEATH of deuterated Py (Py-d$_5$) was studied as well as various mixtures of $^{15}$N-Py and Py-d$_5$ with $^{15}$N-Py and n.a. Py (Table 1). Accordingly, the Py type (n.a. Py, Py-d$_5$, or $^{15}$N-Py) used during the activation period determined the spin configuration of Py in the axial nonexchangeable position of the hexacoordinate Ir-hydride complex, whereas the abundance of the Py type in the mixture determines the most probable type of exchangeable Py in the two equatorial positions. Deuteration of to be-polarized $^{15}$N-substrate had the most detrimental effect on microTesla $^{15}$N effective $T_1$, a decrease from 5.5±0.5 to 2.2±0.1 s for n.a. Py versus Py-d$_5$ (row 1 vs row 2 of Table 1). A similar but slightly larger decrease (from ε≈(−)2900 to (−)850) was observed for the corresponding SABRE-SHEATH $^{15}$N enhancement values, indicating that the majority of deuterium-induced depolarization was due to indirect transfer, for example, from $^{15}$N to $^2$H. However, the direct depolarization losses may have a significant contribution as well. For example, in cases when nondeuterated $^{15}$N-Py was used in combination with Py-d$_5$, microTesla $^{15}$N effective $T_1$ is greater when the catalyst was first activated with Py-d$_5$ versus that when catalyst is first activated with $^{15}$N-Py (15.1±2.3 versus 10.1±0.8 s), but the $^{15}$N signal enhancements were somewhat lower (ε≈(−)400 vs (−)520), indicating that at least some polarization losses occurred on the hyperpolarized Ir-hydride due to the presence of deuterium in the catalyst structure.

The effect of $^{14}$N presence in the catalyst structure as a potential relaxation or polarization sink was studied by comparing two samples prepared using a mixture of $^{15}$N-Py and n.a. Py (consisting mostly of $^{14}$N-Py; rows 6 and 7 of Table 1). Activation of SABRE catalyst with $^{15}$N-Py versus n.a. Py resulted in a slight increase in the microTesla $^{15}$N effective $T_1$ (9.9±1.1 s vs 8.2±1.1 s) as well as the $^{15}$N signal enhancement (ε≈(−)450 vs (−)380), indicating that $^{14}$N presence may act as a weak relaxation or polarization sink, likely through contributions from both mechanisms; that is, direct transfer from hyperpolarized Ir-hydrides and from exchangeable $^{15}$N-Py.

Figure 14:
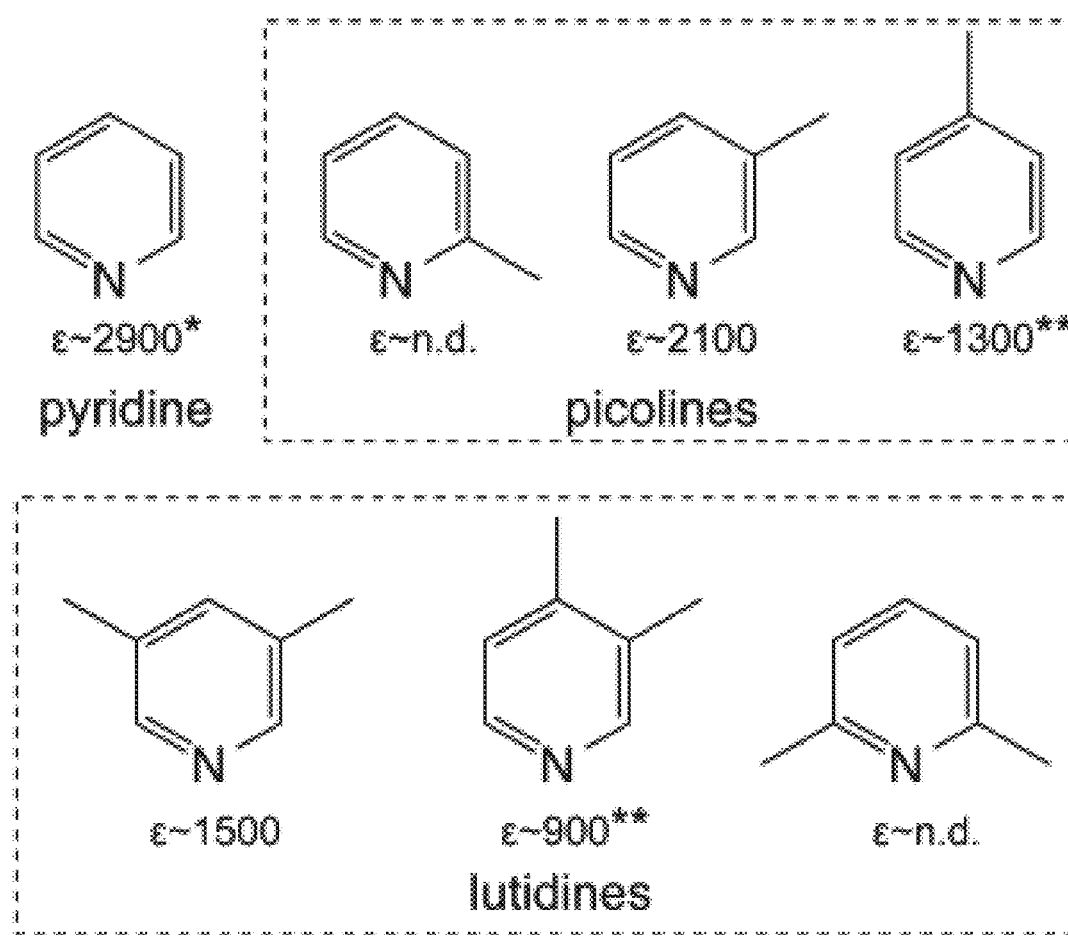
FIG. 14 shows the chemical structures and maximum $^{15}N$ SABRE-SHEATH signal enhancements obtained for pyridine, picolines, and lutidines in neat liquids using ~45 mM catalyst concentration and naturally abundant levels of $^{15}N$ (~0.35%) under ~7 atm of para-$H_2$ pressure and flow rate of 100-120 sccm. The value labeled with a single asterisk (*) corresponds to the optimized catalyst concentration of ~90 mM, the values labeled with double asterisks (**) correspond to the experiments conducted at 5 atm of para-$H_2$ and the flow rate of 60 sccm, and n.d. stands for none detected.

Accordingly, the $^{15}$N SABRE-SHEATH of neat liquids is an advantageous tool for efficient hyperpolarization of $^{15}$N spins, particularly at their low natural abundance level. One potential use is for rapid compound screening, demonstrated on a series of picolines and lutidines shown in FIG. 14. It was determined that the presence of a methyl group in position 2 or 6 results in no detectable $^{15}$N hyperpolarization via SABRE-SHEATH, whereas the substituents in other positions result in $^{15}$N signal enhancements levels similar to those of Py. Steric hindrance induced by the presence of methyl groups in ortho positions significantly alters the time scale of the SABRE exchange process or reduces the association constant.

Picolines and lutidines were chosen because pH-mediated protonation of N-heterocylic compounds can be useful for in vivo pH imaging using conventional proton-based non-hyperpolarized sensing, where the difference in $^{15}$N chemical shift induced by the agent protonation can be useful for pH imaging provided that the agent's pKa is in the physiologically relevant range. $^{15}$N centers of the Py class screened here were identified as promising hyperpolarized pH sensors with potential biomedical application to noninvasively image local variances in tissue pH. Unlike previously demonstrated pH imaging with hyperpolarized H$^{13}$CO$_3^-$/$^{13}$CO$_2$ that relies on the measurement of the ratio of two exchanging species, pH imaging using hyperpolarized $^{15}$N heterocycles relies on the modulation of $^{15}$N chemical shift, which changes by up to 100 ppm between protonated and deprotonated states. This feature offers a significant sensitivity advantage because only one species requires detection (ratiometric measurements are not needed), and low signal-to-noise ratio would not affect the accuracy of the measurement because the chemical shift reports on the pH. Moreover, hyperpolarized $^{15}$N sites have significantly longer $T_1$ in aqueous media (>30 s) compared with $^{13}$C bicarbonate (~10 s), which can also be a significant advantage for in vivo applications (especially relevant for applications involving cancer, given the known hallmarks of elevated glycolysis and mildly acidic microenvironments). The $^{15}$N signal enhancements reported in FIG. 14 may be increased through improved apparatus design, allowing for better access to the hyperpolarization source of para-H$_2$ (as well as reduced transit times to high field for detection). Moreover, the combination of heterogeneous SABRE catalysts with the method presented here may allow preparation of pure hyperpolarized liquids because such solid phase catalysts can be separated and recycled. Nevertheless, the reported $^{15}$N signal enhancement values are already comparable to $^{15}$N enhancements previously reported using dissolution DNP technology and a commercial DNP hyperpolarizer. However, the method reported here achieves the steady-state maximum hyperpolarization level in <1 min without sophisticated equipment, versus ~2 h using expensive DNP hyperpolarizers. SABRE for hyperpolarization of $^{15}$N pH sensors can directly lead to useful in vivo applications because the $^{15}$N SABRE-SHEATH procedure is a relatively simple process and because in vivo pH sensors are useful in metabolic biomedical applications.

Figure 15:
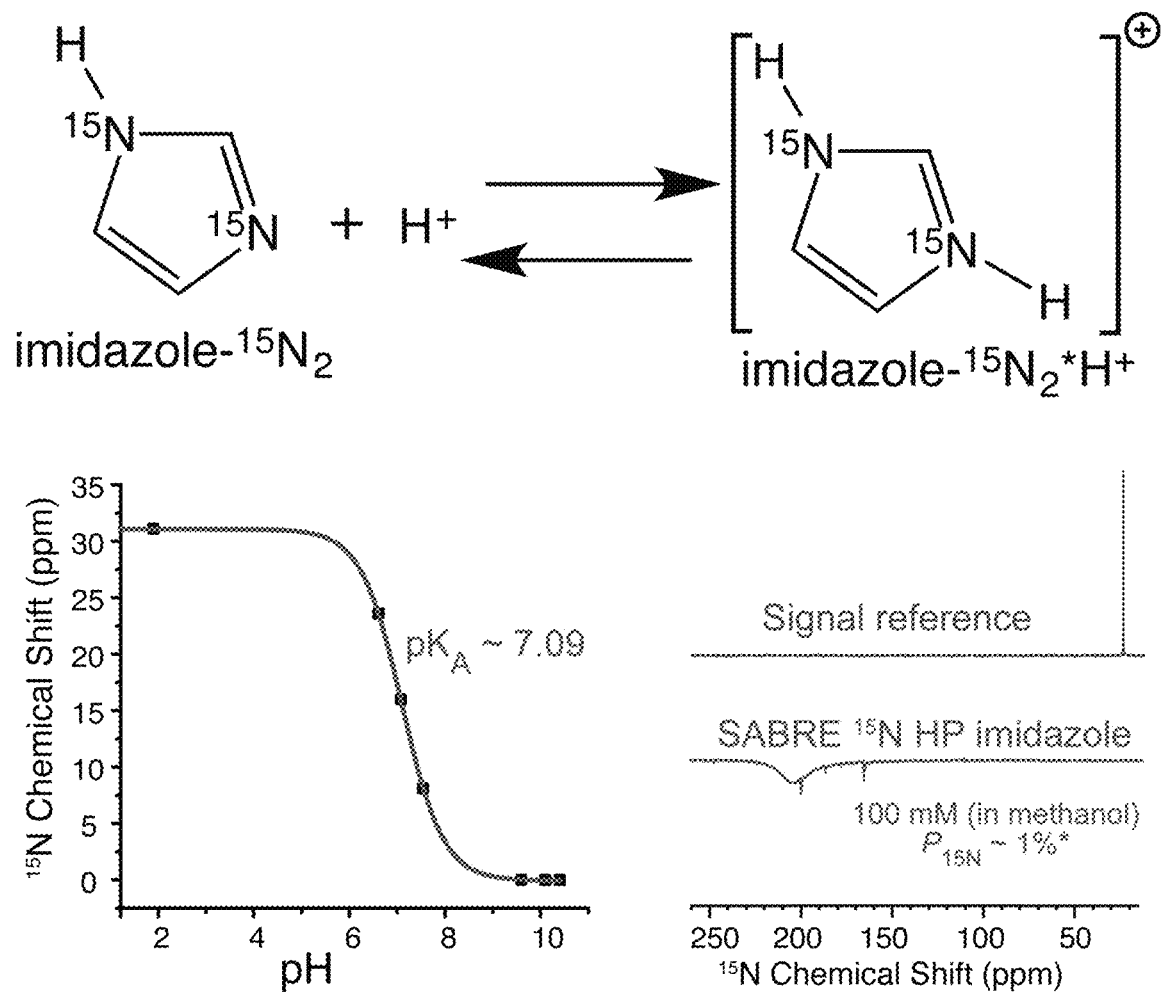
FIG. 15 demonstrates the SABRE-SHEATH hyperpolarization of imidazole and the change in $^{15}N$ chemical shift with protonation of the imidazole nitrogen.

Imidazole-based pH sensors have been known in the context of proton Magnetic Resonance Spectroscopy (MRS). The $^{15}$N chemical shift of imidazole changes by more than 30 ppm upon protonation (FIG. 15). Because pKa of imidazole is ~7.0 and because it is a relatively non-toxic molecule, it may be a potent pH sensor as a $^{15}$N hyperpolarized contrast agent. It is amenable to SABRE-SHEATH hyperpolarization, as can be seen in FIG. 15 with $^{15}$N signal enhancement of >1,000 with already achievable hyperpolarization level of ~1% in the initial proof-of-principle demonstration (FIG. 15).

5. Examples

SABRE Catalyst and Sample Preparation

The SABRE samples were prepared by the addition of an aliquot of $^{15}$N enriched (Sigma-Aldrich, P/N 486183) or natural-abundance Py to a solution of catalyst precursor, resulting in desired concentrations of Py and catalyst. The SABRE catalyst was created using the precursor [IrCl(COD)(IMes)]. The catalyst precursor activation was monitored via in situ detection of HP intermediate Ir-hydride species within a 9.4 T NMR spectrometer by proton NMR spectroscopy using the SABRE effect. Once fully activated, SABRE experiments in the magnetic shield (microtesla) or in the low magnetic field (fringe field of the 9.4 T magnet) of 6±4 mT (FIG. 1) were performed. Some samples were prepared by taking an aliquot of already-activated sample (Py with catalyst) and performing a series of dilutions (one to three) to achieve the desired concentrations. Perdeuterated methanol (methanol-d$_4$) was used as a solvent for all experiments. >90% para-H$_2$, was used for all experiments.

Experimental SABRE Setup at 9.4 T

A freshly prepared sample containing the Ir precursor catalyst and Py in CD$_3$OD was placed inside a 5 mm medium-wall NMR tube (3.43 mm i.d.) for SABRE hyperpolarization. Normal H$_2$ gas or para-H$_2$ gas was bubbled through the methanol-d$_4$ solution via 1/16 in. o.d. (1/32 in. i.d.) tubing inside the NMR tube as shown in FIG. 1. A flow-meter was used to regulate the gas flow at the rate of ~1 mL·atm·s$^{-1}$. The bubbling time and para-H$_2$ pressure varied from ~1 to 60 s and from 1 to ~7 atm, respectively, for SABRE experiments. Activation by $H_2$ bubbling used longer time periods and 1 atm pressure as described earlier. For the in situ SABRE experiments at 9.4 T, para-$H_2$ bubbling occurred inside the NMR magnet, and the signal was acquired (3±2 s) after the bubbling was stopped. For low-field SABRE experiments and SABRE-SHEATH experiments, para-$H_2$ bubbling occurred outside of the NMR detector (in the 6±4 mT fringe field of the NMR magnet) or inside the magnetic shield, respectively (FIG. 1). The sample was manually shuttled to the NMR magnet (9.4 T) into the detection coil, and the signal was recorded with typical transit times of 5±2 s. The experimental setup was modified in studies of $^{15}N$ SABRE-SHEATH signal dependence on the flow rate at four different pressure values by replacing the flow meter (FIG. 1A) with a mass flow controller (Sierra Instruments, Monterey, Calif., model no. C100L-DD-OV1-SV1-PV2-V1-S0-C0).

The NMR signal reference samples for $^{13}C$ and $^{15}N$ were loaded in standard 5 mm (4.14 mm i.d.) NMR tubes. All NMR experiments were conducted with a single-scan acquisition (90° excitation RF pulse) using 400 MHz Bruker Avance III spectrometer unless noted otherwise.

Calculations of NMR Polarization Enhancements at 9.4 T

Calculation of P enhancement ($\varepsilon$) and the % P were performed as follows: $\varepsilon(1H)$ was calculated as the ratio of NMR signals from HP signal ($S_{HP}$) vs thermally polarized equilibrium signal from the same sample at 9.4 T ($S_{THER}$): $\varepsilon(^1H)=S_{HP}/S_{THER}$. The equilibrium signal intensities for $^{15}N$ and $^{13}C$ samples were too low, and signal averaging was impractical due to excessively long (≥1 min) $T_1$ values. Therefore, external signal reference samples of 12.5 M $^{15}N$-Py and neat methanol (24 M with ~1.1% natural abundance of $^{13}C$ isotope) were employed instead. Heteronuclear enhancement values were thus calculated as follows: $\varepsilon(^{15}N$ or $^{13}C)=(S_{HP}/S_{REF})(C_{REF}/C_{HP})(A_{REF}/A_{HP})$, where $C_{REF}$ and $C_{HP}$ are concentrations of reference and HP samples, respectively, $S_{HP}$ and $S_{REF}$ are integrated NMR signals of HP and references samples, respectively, and $A_{REF}$ and $A_{HP}$ are the corresponding cross sectional areas of these solutions. The $A_{REF}/A_{HP}$ ratio was ~1.85, computed as 4.142/(3.432–1.62), where 4.14 mm is the inner diameter of the standard 5 mm NMR tubes used for NMR signal referencing samples, 3.43 mm is the inner diameter of the medium-pressure tubes used for SABRE samples, and 1.6 mm is the outer diameter of the 1/16 in. PTFE tubing inserted into the medium-wall NMR tube for para-$H_2$ bubbling (note that (3.432–1.62) $mm^2$ corresponds to the effective solution cross-section in the medium-wall NMR tubes used for SABRE experiments, in contrast to 4.142 $mm^2$ used for signal reference samples). P was calculated as the following product: $\varepsilon \cdot P_{THER}$, where $P_{THER}$ is the thermal equilibrium nuclear spin polarization of $^1H$, $^{13}C$, or $^{15}N$ nuclei at 9.4 T and 300 K ($3.2\times10^{-5}$, $8.1\times10^{-6}$, and $3.3\times10^{-6}$, respectively).

SABRE-SHEATH Neat Liquid Experiments

Preparation Procedure for Neat Picolines and Lutidines

Non-activated Iridium catalyst prepared in the previous studies, [IrCl(cod)(IMes), 10 mg, 0.015 mmol, MW ~640] was added to an Eppendorf tube followed by the addition of 0.6 mL of the corresponding pyridine analog. The Eppendorf tube was vortexed, and the homogeneous content of the tube was transferred via a glass pipette to a medium-walled NMR (5 mm medium wall precision (3.43 mm ID), NMR Sample Tube 9 in. long, Wilmad glass P/N 503-PS-9) tube equipped with the Teflon tube (0.25 in. OD, 3/16 in. ID) extension, which was approximately 7 cm long. The tube was attached to the previously described setup through a push-to-connect adapter. The sample was activated by running hydrogen or parahydrogen (para-$H_2$) at 5 (sccm) under the pressure of either at ~7 atm or ~5 atm pressure for >1 hour at hydrogen gas flow rate of <10 sccm with flow rate controlled by the mass flow controller (Sierra Instruments, Monterey, Calif., model number C100L-DD-OV1-SV1-PV2-V1-S0-C0). Change of color from dark orange to lighter yellow or reddish was observed after catalyst activation. Partial material loss was detected by the end of the activation period due to sample evaporation due to hydrogen gas bubbling to ~0.35 mL. As a result, the final concentration of catalyst was calculated as the following: [catalyst]=10 (mg)/640 (mg/mole)/0.35 mL~45 mM.

Preparation Procedure for Neat Pyridines

The samples with pyridine (Py) were prepared and activated in the same manner as described for the picolines and lutidines above except that four different catalyst loadings (10 mg, 13 mg, 20 mg and 40 mg) were used for natural abundance (n.a.) Py yielding the following final concentrations: ~45 mM, ~60 mM, ~90 mM and ~180 mM respectively. The solutions of $^{15}N$-Py and perdeuterated (99.5% d) Py were prepared and activated in the same fashion as described above using 20 mg of the same Ir catalyst, and yielding ~90 mM final catalyst concentration.

$^{15}N$ SABRE-SHEATH Hyperpolarization

The sample solution was bubbled with para-$H_2$ (the period of bubbling, flow rate, and pressure were varied depending on the goal of the experiment) inside the magnetic shield (Lake Shore Cryotronics, P/N 4065). This was followed by a rapid sample transfer from the shield to Earth magnetic field followed by quenching the flow of para-$H_2$ and sample insertion in the bore of 9.4 T magnet and acquisition of $^{15}N$ NMR spectrum. In case of the $^{15}N$ $T_1$ measurements in the microTesla field of the magnetic shield, the para-$H_2$ flow was stopped while the sample remained in the shield before it was removed from the shield. The increase of the time period that the sample spent inside the shield after para-$H_2$ flow was stopped resulted in the decrease of the induced $^{15}N$ SABRE-SHEATH hyperpolarized signal detected in the 9.4 T spectrometer, allowing to conveniently measure the effective decay of $^{15}N$ hyperpolarization in the shield.

$^1H$ SABRE Hyperpolarization

The sample tube with activated catalyst and to-be-hyperpolarized substrate is placed in the fringe field of the magnet at 6±4 mT (calibrated with gauss meter), and parahydrogen is bubbled for about 20-30 seconds. The exponential build-up constant for $^1H$ SABRE is about 7.4 s, and 20-30 seconds of para-$H_2$ bubbling is sufficient to reach the steady-state level of $^1H$ hyperpolarization.

The results of activation of the Ir catalyst with n.a. Py (FIG. 16), Py-$d_5$ (FIG. 17), $^{15}N$-Py (FIG. 18), $^{15}N$-Py followed by Py-$d_5$ (FIG. 19), Py-$d_5$ followed by $^{15}N$-Py (FIG. 20), $^{15}N$-Py followed by n.a. Py (FIG. 21), and n.a. Py followed by $^{15}N$-Py (FIG. 22) are shown in FIGS. 16-22.

For reasons of completeness, various aspects of the present disclosure are set out in the following numbered clauses:

Clause 1. A method of hyperpolarizing heteronuclei, the method comprising: (a) combining parahydrogen, a compound comprising at least one hyperpolarizable heteronucleus, and a catalyst to form a mixture; and (b) applying a magnetic field to the mixture, wherein the magnetic field causes the matching of the resonance frequency of parahydrogen with the resonance frequency of the at least one hyperpolarizable heteronucleus, thereby transferring the spin order from parahydrogen to the at least one hyperpolarizable heteronucleus.

Clause 2. The method of clause 1, wherein the spin order is transferred during a temporary association of parahydrogen, the compound, and the catalyst while maintaining the chemical identity of the compound.

Clause 3. The method of clause 1, wherein the resonance frequencies of parahydrogen and the at least one hyperpolarizable heteronucleus are within an order of magnitude of each other.

Clause 4. The method of clause 1, wherein the resonance frequencies of parahydrogen and the at least one hyperpolarizable heteronucleus are different.

Clause 5. The method of clause 1, wherein the magnetic field has a strength of less than 50 µT.

Clause 6. The method of clause 1, wherein the magnetic field has a strength of less than 20 µT.

Clause 7. The method of clause 1, wherein the magnetic field has a strength of less than 5 µT.

Clause 8. The method of clause 1, wherein the magnetic field has a strength of about 0.1 to about 1 µT.

Clause 9. The method of clause 1, wherein the at least one heteronucleus is selected from the group consisting of $^{13}C$, $^{15}N$, $^{19}F$, $^{29}Si$, $^{31}P$, $^{2}H$ and $^{129}Xe$.

Clause 10. The method of clause 1, wherein the at least one heteronucleus is $^{15}N$.

Clause 11. The method of clause 1, wherein the mixture further comprises a solvent.

Clause 12. The method of clause 11, wherein the solvent is a deuterated solvent.

Clause 13. The method of clause 1, wherein the catalyst is a heterogeneous catalyst.

Clause 14. The method of clause 1, wherein the catalyst is a homogeneous catalyst.

Clause 15. The method of clause 1, wherein the catalyst comprises a transition metal.

Clause 16. The method of clause 15, wherein the transition metal is iridium.

Clause 17. The method of clause 1, wherein the catalyst is [IrCl(COD)(IMes)].

Clause 18. The method of clause 1, wherein the catalyst is a homogeneous or heterogeneous catalyst, wherein the catalyst accommodates the simultaneous exchange of para-$H_2$ and heteronuclear spin center(s), and wherein the condition of spin-spin (weak or strong J) coupling between para-$H_2$ derived protons and heteronuclear spin center(s) is maintained.

Clause 19. The method of clause 1, wherein the compound is isotopically enriched.

Clause 20. The method of clause 1, wherein the compound is a contrast agent for an in vivo imaging technique.

Clause 21. A method of obtaining an MRI image, the method comprising: (a) combining parahydrogen, a compound comprising at least one hyperpolarizable heteronucleus, and a catalyst to form a mixture; (b) applying a magnetic field to the mixture, wherein the magnetic field causes the matching of the resonance frequency of parahydrogen with the resonance frequency of the at least one hyperpolarizable heteronucleus of the compound, thereby transferring the spin order from parahydrogen to the at least one hyperpolarizable heteronucleus; and (c) performing an MRI measurement or MR spectroscopy on the compound.

Clause 22. A method of in vivo pH sensing, the method comprising: (a) combining parahydrogen, a compound comprising at least one hyperpolarizable heteronucleus, and a catalyst to form a mixture; wherein the compound has at least one pKa value of about 6 to about 9; (b) applying a magnetic field to the mixture, wherein the magnetic field causes the matching of the resonance frequency of parahydrogen with the resonance frequency of the at least one hyperpolarizable heteronucleus of the compound, thereby transferring the spin order from parahydrogen to the at least one hyperpolarizable heteronucleus; (c) removing the catalyst from the mixture; and (d) performing an in vivo imaging measurement on the compound.

Clause 23. A method of performing an NMR experiment, the method comprising: (a) combining parahydrogen, a compound comprising at least one hyperpolarizable heteronucleus, and a catalyst to form a mixture; (b) applying a magnetic field to the mixture, wherein the magnetic field causes the matching of the resonance frequency of parahydrogen with the resonance frequency of the at least one hyperpolarizable heteronucleus, thereby transferring the spin order from parahydrogen to the at least one hyperpolarizable heteronucleus; and (c) performing an NMR measurement on the compound.

Clause 24. The method of clause 23, wherein the spin order is transferred during a temporary association of parahydrogen, the compound, and the catalyst while maintaining the chemical identity of the compound.

Clause 25. The method of clause 23, wherein the chemical structure of the compound provided in step (a) is the same as the chemical structure of the compound subject to the NMR experiment in step (c).

Clause 26. The method of clause 23, wherein the resonance frequencies of parahydrogen and the at least one hyperpolarizable heteronucleus are within an order of magnitude of each other.

Clause 27. The method of clause 23, wherein the resonance frequencies of parahydrogen and the at least one hyperpolarizable heteronucleus are different.

Clause 28. The method of clause 23, wherein the NMR experiment produces at least one enhanced signal in the NMR spectrum of the compound.

Clause 29. The method of clause 23, wherein the magnetic field has a strength of less than 50 µT.

Clause 30. The method of clause 23, wherein the magnetic field has a strength of less than 20 µT.

Clause 31. The method of clause 23, wherein the magnetic field has a strength of less than 5 µT.

Clause 32. The method of clause 23, wherein the magnetic field has a strength of about 0.1 to about 1 µT.

Clause 33. The method of clause 23, wherein the at least one hyperpolarizable heteronucleus is selected from the group consisting of $^{13}C$, $^{15}N$, $^{19}F$, $^{29}Si$, $^{31}P$, $^{2}H$ and $^{129}Xe$.

Clause 34. The method of clause 23, wherein the at least one hyperpolarizable heteronucleus is $^{15}N$.

Clause 35. The method of clause 23, wherein the mixture further comprises a solvent.

Clause 36. The method of clause 35, wherein the solvent is a deuterated solvent.

Clause 37. The method of clause 23, wherein the catalyst is a heterogeneous catalyst.

Clause 38. The method of clause 23, wherein the catalyst is a homogeneous catalyst.

Clause 39. The method of clause 23, wherein the catalyst comprises a transition metal.

Clause 40. The method of clause 39, wherein the transition metal is iridium.

Clause 41. The method of clause 23, wherein the catalyst is [IrCl(COD)(IMes)].

Clause 42. The method of clause 23, wherein the catalyst is a homogeneous or heterogeneous catalyst, wherein the catalyst accommodates the simultaneous exchange of para-$H_2$ and heteronuclear spin center(s), and wherein the condition of spin-spin (weak or strong J) coupling between para-$H_2$ derived protons and heteronuclear spin center(s) is maintained.

Clause 43. The method of clause 23, wherein the compound is isotopically enriched.

Clause 44. The method of clause 23, wherein the compound is a contrast agent for an in vivo imaging technique.

Clause 45. A method of performing an NMR experiment, the method comprising: (a) combining parahydrogen, a compound comprising at least one hyperpolarizable heteronucleus, and a catalyst to form a mixture; (b) applying a magnetic field with a strength of less than 50 µT to the mixture, thereby transferring the spin order from parahydrogen to the at least one hyperpolarizable heteronucleus; and (c) performing an NMR measurement on the compound.

Clause 46. The method of clause 45, wherein the spin order is transferred during a temporary association of parahydrogen, the compound, and the catalyst while maintaining the chemical identity of the compound.

Clause 47. The method of clause 45, wherein the chemical structure of the compound provided in step (a) is the same as the chemical structure of the compound subject to the NMR experiment in step (c).

Clause 48. The method of clause 45, wherein the resonance frequencies of parahydrogen and the at least one hyperpolarizable heteronucleus are within an order of magnitude of each other.

Clause 49. The method of clause 45, wherein the resonance frequencies of parahydrogen and the at least one hyperpolarizable heteronucleus are different.

Clause 50. The method of clause 45, wherein the magnetic field is determined by matching the resonance frequency of parahydrogen with the resonance frequency of the at least one hyperpolarizable nucleus of the compound.

Clause 51. The method of clause 45, wherein the NMR experiment produces at least one enhanced signal in the NMR spectrum of the compound.

Clause 52. The method of clause 45, wherein the magnetic field has a strength of less than 20 µT.

Clause 53. The method of clause 45, wherein the magnetic field has a strength of less than 5 µT.

Clause 54. The method of clause 45, wherein the magnetic field has a strength of about 0.1 to about 1 µT.

Clause 55. The method of clause 45, wherein the at least one heteronucleus is selected from the group consisting of $^{13}C$, $^{15}N$, $^{19}F$, $^{29}Si$, $^{31}P$, $^{2H}$ and $^{129}Xe$.

Clause 56. The method of clause 45, wherein the at least one heteronucleus is $^{15}N$.

Clause 57. The method of clause 45, wherein the mixture further comprises a solvent.

Clause 58. The method of clause 57, wherein the solvent is a deuterated solvent.

Clause 59. The method of clause 45, wherein the catalyst is a heterogeneous catalyst.

Clause 60. The method of clause 45, wherein the catalyst is a homogeneous catalyst.

Clause 61. The method of clause 45, wherein the catalyst comprises a transition metal.

Clause 62. The method of clause 61, wherein the transition metal is iridium.

Clause 63. The method of clause 45, wherein the catalyst is [IrCl(COD)(IMes)].

Clause 64. The method of clause 45, wherein the catalyst is a homogeneous or heterogeneous catalyst, wherein the catalyst accommodates the simultaneous exchange of para-$H_2$ and heteronuclear spin center(s), and wherein the condition of spin-spin (weak or strong J) coupling between para-$H_2$ derived protons and heteronuclear spin center(s) is maintained.

Clause 65. The method of clause 45, wherein the compound is isotopically enriched.

Clause 66. The method of clause 45, wherein the compound is a contrast agent for an in vivo imaging technique.

Clause 67. A method of hyperpolarizing heteronuclei, the method comprising: (a) combining parahydrogen, a compound comprising at least one hyperpolarizable heteronucleus, and a catalyst to form a mixture; and (b) applying a magnetic field with a strength of less than 50 T to the mixture, thereby transferring the spin order from parahydrogen to the at least one hyperpolarizable heteronucleus.

Clause 68. The method of clause 67, wherein the spin order is transferred during a temporary association of parahydrogen, the compound, and the catalyst while maintaining the chemical identity of the compound.

Clause 69. The method of clause 67, wherein the resonance frequencies of parahydrogen and the at least one hyperpolarizable heteronucleus are within an order of magnitude of each other.

Clause 70. The method of clause 67, wherein the resonance frequencies of parahydrogen and the at least one hyperpolarizable heteronucleus are different.

Clause 71. The method of clause 67, wherein the magnetic field is determined by matching the resonance frequency of parahydrogen with the resonance frequency of at least one hyperpolarizable nucleus of the compound.

Clause 72. The method of clause 67, wherein the magnetic field has a strength of less than 20 µT.

Clause 73. The method of clause 67, wherein the magnetic field has a strength of less than 5 µT.

Clause 74. The method of clause 67, wherein the magnetic field has a strength of about 0.1 to about 1 µT.

Clause 75. The method of clause 67, wherein the at least one heteronucleus is selected from the group consisting of $^{13}C$, $^{15}N$, $^{19}F$, $^{29}Si$, $^{31}P$, $^{2}H$ and $^{129}Xe$.

Clause 76. The method of clause 67, wherein the at least one heteronucleus is $^{15}N$.

Clause 77. The method of clause 67, wherein the mixture further comprises a solvent.

Clause 78. The method of clause 77, wherein the solvent is a deuterated solvent.

Clause 79. The method of clause 67, wherein the catalyst is a heterogeneous catalyst.

Clause 80. The method of clause 67, wherein the catalyst is a homogeneous catalyst.

Clause 81. The method of clause 67, wherein the catalyst comprises a transition metal.

Clause 82. The method of clause 81, wherein the transition metal is iridium.

Clause 83. The method of clause 67, wherein the catalyst is [IrCl(COD)(IMes)].

Clause 84. The method of clause 67, wherein the catalyst is a homogeneous or heterogeneous catalyst, wherein the catalyst accommodates the simultaneous exchange of para-$H_2$ and heteronuclear spin center(s), and wherein the condition of spin-spin (weak or strong J) coupling between para-$H_2$ derived protons and heteronuclear spin center(s) is maintained.

Clause 85. The method of clause 67, wherein the compound is isotopically enriched.

Clause 86. The method of clause 67, wherein the compound is a contrast agent for an in vivo imaging technique.

Clause 87. A method of performing an NMR experiment, the method comprising: (a) combining parahydrogen, a compound comprising at least one hyperpolarizable heteronucleus, and a catalyst to form a mixture; (b) applying a magnetic field with a strength of less than 50 µT to the mixture, thereby transferring the spin order from parahydrogen to the at least one hyperpolarizable heteronucleus; and (c) performing an NMR measurement on the compound.

Clause 88. The method of clause 87, wherein the NMR experiment produces at least one enhanced signal in the NMR spectrum of the compound.

Clause 89. A method of obtaining an MRI image, the method comprising: (a) combining parahydrogen, a compound comprising at least one hyperpolarizable heteronucleus, and a catalyst to form a mixture; (b) applying a magnetic field with a strength of less than 50 µT to the mixture, thereby transferring the spin order from parahydrogen to the at least one hyperpolarizable heteronucleus; and (c) performing an MRI measurement or MR spectroscopy on the compound.

Clause 90. A method of in vivo pH sensing, the method comprising: (a) combining parahydrogen, a compound comprising at least one hyperpolarizable heteronucleus, and a catalyst to form a mixture; wherein the compound has at least one pKa value of about 6 to about 9; (b) applying a magnetic field with a strength of less than 50 µT to the mixture, thereby transferring the spin order from parahydrogen to the at least one hyperpolarizable heteronucleus; (c) removing the catalyst from the mixture; and (d) performing an in vivo imaging measurement on the compound.

It is understood that the foregoing detailed description and accompanying examples are merely illustrative and are not to be taken as limitations upon the scope of the invention, which is defined solely by the appended claims and their equivalents.

Various changes and modifications to the disclosed embodiments will be apparent to those skilled in the art. Such changes and modifications, including without limitation those relating to the chemical structures, substituents, derivatives, intermediates, syntheses, compositions, formulations, or methods of use of the invention, may be made without departing from the spirit and scope thereof.

What is claimed is:

1. A method of hyperpolarizing heteronuclei, the method comprising:
   (a) combining parahydrogen, a compound comprising at least one hyperpolarizable heteronucleus, and a catalyst to form a mixture;
   (b) applying a magnetic field with a strength of about 0.1 to about 10 µT to the mixture; and
   (c) directly transferring spin order from parahydrogen to the at least one hyperpolarizable heteronucleus,
   wherein the application of the magnetic field and the direct transfer of spin order are without radio frequency (rf) irradiation,
   wherein the at least one heteronucleus is $^{15}N$, and
   wherein the catalyst is [IrCl(COD)(IMes)].

2. The method of claim 1, wherein the spin order is transferred during a temporary association of parahydrogen, the compound, and the catalyst while maintaining the chemical identity of the compound.

3. The method of claim 1, wherein the resonance frequencies of parahydrogen and the at least one hyperpolarizable heteronucleus are different.

4. The method of claim 1, wherein the magnetic field is determined by matching the resonance frequency of parahydrogen with the resonance frequency of at least one hyperpolarizable nucleus of the compound.

5. The method of claim 1, wherein the magnetic field has a strength of about 0.1 to about 1 µT.

6. The method of claim 1, wherein the mixture further comprises a solvent.

7. The method of claim 6, wherein the solvent is a deuterated solvent.

8. The method of claim 1, wherein the catalyst accommodates the simultaneous exchange of para-H2 and heteronuclear spin center(s), and wherein the condition of spin-spin (weak or strong J) coupling between para-H2 derived protons and heteronuclear spin center(s) is maintained.

9. The method of claim 1, wherein the compound is isotopically enriched.

10. The method of claim 1, wherein the compound is a contrast agent for an in vivo imaging technique.

11. A method of performing an NMR experiment, the method comprising:
    (a) combining parahydrogen, a compound comprising at least one hyperpolarizable heteronucleus, and a catalyst to form a mixture;
    (b) applying a magnetic field with a strength of about 0.1 to about 10 µT to the mixture;
    (c) directly transferring spin order from parahydrogen to the at least one hyperpolarizable heteronucleus; and
    (d) performing an NMR measurement on the compound,
    wherein the application of the magnetic field and the direct transfer of spin order are without radio frequency (rf) irradiation,
    wherein the at least one heteronucleus is $^{15}N$, and
    wherein the catalyst is [IrCl(COD)(IMes)].

12. A method of obtaining an MRI image, the method comprising:
    (a) combining parahydrogen, a compound comprising at least one hyperpolarizable heteronucleus, and a catalyst to form a mixture;
    (b) applying a magnetic field with a strength of about 0.1 to about 10 µT to the mixture;
    (c) directly transferring spin order from parahydrogen to the at least one hyperpolarizable heteronucleus; and
    (d) performing an MRI measurement or MR spectroscopy on the compound,
    wherein the application of the magnetic field and the direct transfer of spin order are without radio frequency (rf) irradiation,
    wherein the at least one heteronucleus is $^{15}N$, and
    wherein the catalyst is [IrCl(COD)(IMes)].

13. A method of in vivo pH sensing, the method comprising:
    (a) combining parahydrogen, a compound comprising at least one hyperpolarizable heteronucleus, and a catalyst to form a mixture; wherein the compound has at least one pKa value of about 6 to about 9;
    (b) applying a magnetic field with a strength of about 0.1 to about 10 µT to the mixture;

(c) directly transferring spin order from parahydrogen to the at least one hyperpolarizable heteronucleus;
(d) removing the catalyst from the mixture; and
(e) performing an in vivo imaging measurement on the compound, wherein the application of the magnetic field and the direct transfer of spin order are without radio frequency (rf) irradiation, wherein the at least one heteronucleus is $^{15}$N, and wherein the catalyst is [IrCl(COD)(IMes)].

14. The method of claim 1, wherein the magnetic field has a strength of about 0.1 to about 5 µT.

15. The method of claim 1, wherein the magnetic field has a strength of about 0.1 to about 3 µT.

16. The method of claim 1, wherein directly transferring spin order comprises J-coupling between the at least one heteronucleus and parahydrogen-derived hydrides on the catalyst, and overpopulating a spin state of the at least one heteronucleus.

17. The method of claim 1, wherein the spin order produced on the at least one heteronucleus corresponds to $I_z$-magnetization on the at least one heteronucleus.

18. The method of claim 1, wherein the spin order produced on the at least one heteronucleus corresponds to alignment or anti-alignment with the magnetic field.

19. The method of claim 1 conducted inside a magnetic shield.

20. The method of claim 11, further comprising detecting an in-phase signal of the at least one heteronucleus in the NMR measurement on the compound.

21. The method of claim 20, further comprising detecting the in-phase signal without detecting an anti-phase signal.

* * * * *